United States Patent [19]

Harari

[11] Patent Number: 4,933,739
[45] Date of Patent: Jun. 12, 1990

[54] TRENCH RESISTOR STRUCTURES FOR COMPACT SEMICONDUCTOR MEMORY AND LOGIC DEVICES

[76] Inventor: Eliyahou Harari, 2320 Friars La., Los Altos, Calif. 94022

[21] Appl. No.: 185,699

[22] Filed: Apr. 26, 1988

[51] Int. Cl.[5] .................... H01L 29/06; H01L 29/04; H01L 27/02
[52] U.S. Cl. ........................................ 357/55; 357/59; 357/51; 357/43
[58] Field of Search ................... 357/55, 59 F, 51, 34, 357/43

[56] References Cited

U.S. PATENT DOCUMENTS 3,617,826 11/1971 Kobayashi ................... 357/59 H
4,569,122 2/1986 Chan ................... 357/59 I

FOREIGN PATENT DOCUMENTS 57126 8/1982 European Pat. Off. .......... 357/55
239052 11/1985 Japan ...................... 357/51
35558 2/1987 Japan ...................... 357/51

OTHER PUBLICATIONS

Chatterje et al., IEEE, IDEM-86, "Trench and Compact Structures for dRAMS" (1986) pp. 128–131.
Ueno et al., IEEE, IDEM 87, "A SUB-40 PS ECL Circuit at a Switching Current of 1.28 MA" (1987) pp. 371–374.
Komatsu et al., IEEE Journal of Solid-State Circuits, "A 35–ns 128KX8 CMOS SRAM" (1987) 22:721–726.
Hanamura et al., IEEE Int. Solid-State Circuits Conference, "High Density SRAMs" (1987) pp. 250–251 and 414.
Oguie et al., IEEE Journal of Solid-State Circuits, "31–ns, 500–mW, 64–kbit ECL RAM Using HI-BICMOS Technology" (1986) 21:681–658.
Oguie et al.,, IEEE, IDEM 86, "Technology Improvement for High Speed ECL RAMs" (1986) pp. 468–471.

Primary Examiner—Rolf Hille
Assistant Examiner—Robert P. Limanek
Attorney, Agent, or Firm—Steven F. Caserza

[57] ABSTRACT

A vertical trench etched several microns deep into the silicon extending into a buried diffusion region is used to confine a vertical interconnect element. This element can be a high resistivity undoped polycrystalline silicon load resistor, a medium resistivity doped polycrystalline silicon load resistor, or a low resistivity interconnect to the buried diffusion region. This new structure can be used in compact and scalable MOS and bipolar inverters and in bistable memory storage cells.

64 Claims, 15 Drawing Sheets

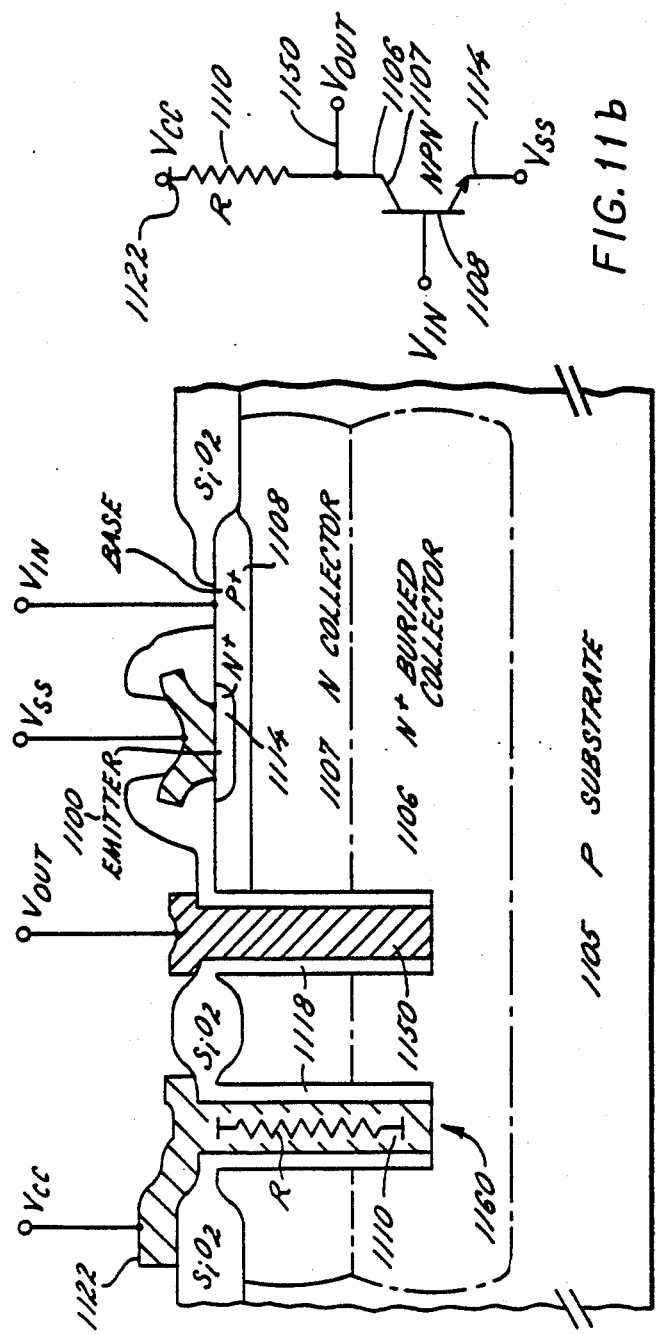

TRENCH RESISTOR STRUCTURES FOR COMPACT SEMICONDUCTOR MEMORY AND LOGIC DEVICES

BACKGROUND OF THE INVENTION

This invention relates to the use of compact trench resistor structures in conjunction with MOS and bipolar transistors and logic inverters to achieve static random access memories and logic elements which are more compact than hitherto possible.

In recent years, the drive towards higher density integrated circuits resulted in the development of trench structures to improve device density. Trenches are regions in the silicon which are etched vertically downwards several microns deep into the silicon wafer, using anisotropic reactive ion etching (RIE). The two major applications widely reported for this technique are for use as charge storage capacitors in dynamic random access memory (DRAM) cells, and for device isolation in advanced CMOS, bipolar, and BICMOS technologies.

The prior art trench DRAM cell 100 (FIG. 1) includes an access transistor consisting of gate 101 which is part of a word line, drain 102 which is part of a bit line, storage node 103, and trench capacitor 106 which is electrically connected to storage node 103. Trench capacitor 106 consists of a deep trench etched into the silicon surface with essentially vertical walls 104, diffused silicon region 103a serving as the first electrode of trench capacitor 106, dielectric insulation layer 105, and polycrystalline silicon field plate 108 serving as the second electrode of the trench capacitor. The storage capacitance of trench capacitor 106 can be increased by making the trench deeper. Oxide isolation regions 107, 109 are used to isolate cell 100 from adjacent cells and trenches in a memory array.

There are several other variations of the use of the trench structure for high density DRAM cells. A good review article of the various DRAM cells previously proposed is provided by Chatterje et al., "Trench and Compact Structures for DRAMs", *Technical Digest of IEEE International Electron Devices Meeting,* December 1986, p. 128.

The second use proposed for trench structures is for electrical isolation between adjacent transistors in high density CMOS or bipolar circuits. Trenches one to two microns wide and several microns deep are etched into the silicon along the periphery of active regions, thereby separating adjacent transistors. These trenches are filled with dielectric isolation material (usually chemical vapor deposition of $SiO_2$, capped by undoped polycrystalline silicon to fill the cavity of the trench). An example of a prior art device using such isolation is provided in an article by Ueno et al., "A sub-40 picosecond ECL circuit at a switching current of 1.2 mA", *Technical Digest of IEEE International Electron Devices Meeting,* December 1987, p. 371.

Prior art static random access memory (SRAM) cells employ a pair of cross-coupled inverters (flip flops) which are stable in one or the other of two binary states. Each of the two inverters consists of a switching transistor and a pullup load device. This load device may be a transistor or a resistor. The highest density SRAM devices available commercially employ a cell consisting of four N channel MOS (NMOS) transistors and two resistors. FIG. 2a is a schematic diagram of such a prior art SRAM cell. Transistors $T_1$ and $T_2$ are the switching transistors of the cross-coupled inverters. Transistors $T_3$ and $T_4$ are access transistors through which the binary state on nodes $O_1$ and $O_2$ is sensed during read by a sense amplifier (not shown) connected to bit lines D, $\overline{D}$ and through which new data from D and $\overline{D}$ is written into the memory cell. Resistors $R_1$ and $R_2$ are very high resistivity loads. The high resistance is necessary in order to minimize the quiescent power dissipation through the one of the two cross-coupled inverters whose transistor ($T_1$ or $T_2$) is switched on at any one time. Typically, the current through either one of the load resistors is in the nanoamp range or lower.

A compact SRAM cell is achieved by implementing the high resistivity loads in a layer of undoped or lightly doped polycrystalline silicon. An example of such prior art cell is described by Komatsu et al., "A 35 nanosecond 128K×8 CMOS SRAM", *IEEE Journal of Solid-State Circuits,* Oct. 1987, SC-22:721. These polycrystalline silicon loads are typically 500 nanometers or less in thickness, one to two microns wide, and three to eight microns long. Two such resistors are required per cell, consuming a significant amount of device surface area even when implemented in a second or third layer of polycrystalline silicon which can be placed at least partially physically above the two switching transistors $T_1$, $T_2$. The implementation of polycrystalline silicon load resistors also requires three additional masking steps, the first to define buried contacts from load resistors to diffusions, the second to define the geometry of the resistors in the layer of polycrystalline silicon, and the third to protect the resistor areas during doping of the other areas of the polycrystalline silicon to achieve electrical contact to the Vcc supply, in order to maintain the high resistivity of resistors $R_1$ and $R_2$. A great deal of effort has been spent in the industry to scale down the size of the polycrystalline silicon resistors. The main problem with scaling is due to sideways diffusion of arsenic or phosphorous dopants along polycrystalline silicon grain boundaries resulting in unacceptably high leakage currents. To eliminate such problems, some prior art devices eliminate altogether the load elements, relying instead on temporary storage of charge on the parasitic capacitances of nodes $O_1$, $O_2$ (FIG. 2b). Such an approach is described by Hanamura et al., "A 256K CMOS SRAM with internal refresh", *Digest of Technical Papers from* 1987 ISSCC, FAM 19.1, p. 250. Hanamura claims that elimination of the high resistivity polycrystalline silicon loads results in a SRAM cell which is approximately 30% smaller, and is altogether more scalable at higher densities. Unfortunately, Hanamura's cell requires periodic refresh of every bit in the memory array to reinforce the charge on storage nodes $O_1$, $O_2$. This forces a memory cycle time which is double the memory access time, in contrast to SRAMs using polycrystalline silicon loads where cycle time and access time are the same, and where no extra circuitry is required for the refresh cycle.

Prior art semiconductor structures have also had difficulty in providing a good, low resistivity interconnection path between the surface of the semiconductor and buried diffusion regions. Such a buried diffusion may be the buried collector of a vertical NPN transistor, the N+ or P+ buried diffusions underlying PMOS and NMOS transistors, respectively, in CMOS or BICMOS structures, or N++ or P++ substrates carrying one of the supply voltages in an epitaxial structure. FIG. 3a shows a cross section of a prior art vertical NPN bipolar transistor 300 (taken from the Ueno paper referenced above). In this transistor, isolation trench 320 surrounding NPN transistor 300 is etched through an N− epitaxial layer 307 and through a second N+ epitaxial layer 306 grown on P− substrate 305. Walls 301 of isolation trench 320 are insulated with thin oxide film 302 and trench 320 is filled with polycrystalline silicon 303 to achieve a flat surface topology. Shallow N+ emitter region 314 is formed by out diffusion from N+ doped polycrystalline silicon layer 311, P+ base region 308 is contacted with polycrystalline silicon 310, and N− on N+ buried collector 306 is contacted from the top surface through N+ downward diffusion 309, using N+ doped polycrystalline silicon 312 as the diffusion dopant source. This N+ diffusion 309 requires a prolonged high temperature diffusion cycle which is detrimental to other shallow junctions in this structure, and introduces a collector series resistance.

FIG. 4 shows the cross section of another prior art BICMOS structure, as shown by Ogiue et al., "13ns, 500 mW, 64K bit ECL RAM using HI-BICMO Technology, " *IEEE Journal of Solid State Circuits*, Oct. 1986, SC-21:681. In this structure, bipolar transistor 400 is a vertical NPN transistor similar to prior art transistor 300 (FIG. 3). PMOS transistor 440 has its N well 423 and source diffusion 424 held at Vcc potential, supplied by a top surface Vcc metal bus line (not shown). NMOS transistor 450 has its P well 428 and source diffusion 429 held at ground potential, supplied by another top surface ground metal bus line. These metal lines as well as additional metal lines serving as the P+ to N well straps and N+ to P well straps consume significant surface area in prior art structures.

SUMMARY

In accordance with this invention, trenches etched vertically several microns deep into the semiconductor to reach into a buried diffusion layer are used to narrowly confine either a very high resistivity material such as intrinsic (i.e. undoped) or lightly doped polycrystalline silicon, or alternately a very low resistivity material such as a silicide of tungsten or titanium, or a metallic conductor such as tungsten, or a refractory metal such as molybdenum. The material confined to inside the trench is made to contact the buried diffusion at the bottom of the trench, forming either a buried contact, a buried diode, or a buried ohmic contact. The sidewalls, but not the bottom wall, of each trench may, for some applications, be insulated with a thin dielectric isolation film. For other applications, this insulation is not necessary.

In a first embodiment of the new trench structure, very high resistivity vertical resistors formed in undoped polycrystalline silicon confined inside the trench are used to achieve compact and highly scalable load resistors for high density and low power SRAM arrays. Each of the two storage nodes in a four transistor SRAM cell are electrically connected through deep trenches etched into the silicon so as to reach through a P well (or P type epitaxial layer) to an N+ buried diffusion in a P substrate. These trenches are filled with high resistivity polycrystalline silicon forming the vertical load resistors.

In a second embodiment, low resistivity vertical columns confined within trenches with a narrow aperture opening are used as low resistivity electrical interconnects between surface diffusions and diffusion layers buried several microns below the surface of the silicon.

In a third embodiment, low resistivity vertical trench interconnects are used to vertically supply one of the supply voltages from a heavily doped substrate to any surface diffusion, thereby eliminating the need for metal power bus lines occupying surface area.

In a fourth embodiment, trench resistors having intermediate resistivity embedded inside vertical trenches are used as pullup load elements in high speed bipolar logic inverters and SRAM cells.

BRIEF DESCRIPTION OF THE DRAWINGS

FIG. 11a is a cross-sectional view of one embodiment of a bipolar inverter structure combining a medium resistivity trench load resistor and a low resistivity trench connector, both contacting a buried collector;

FIG. 11b is a schematic diagram of the bipolar inverter of FIG. 11a; and

DETAILED DESCRIPTION

I. Inverter with Trench Resistor Load Structure

Figure 5D:
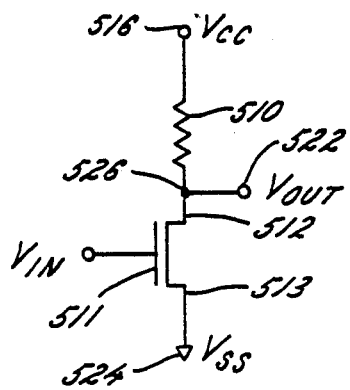
FIG. 5d is a schematic diagram depicting the electrical circuit of the embodiment of FIGS. 5a through 5c.
Figure 5A:
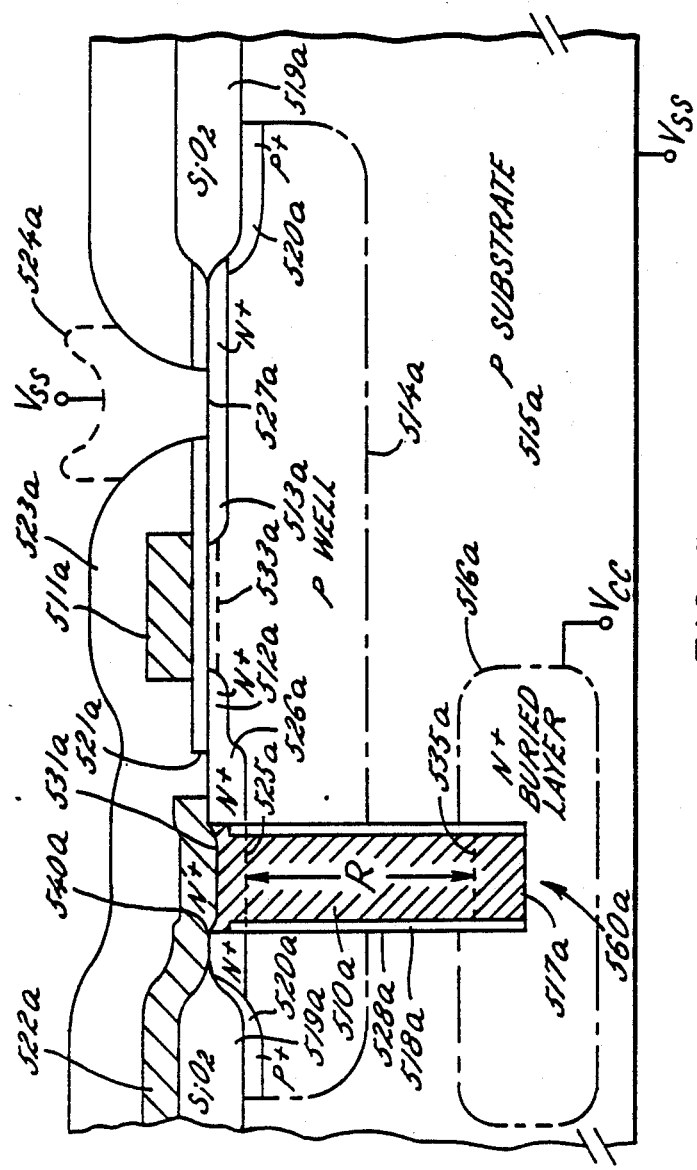
FIG. 5a is a cross sectional view of one embodiment of a structure utilizing a trench load resistor in accordance with the teachings of this invention.
Figure 5B:
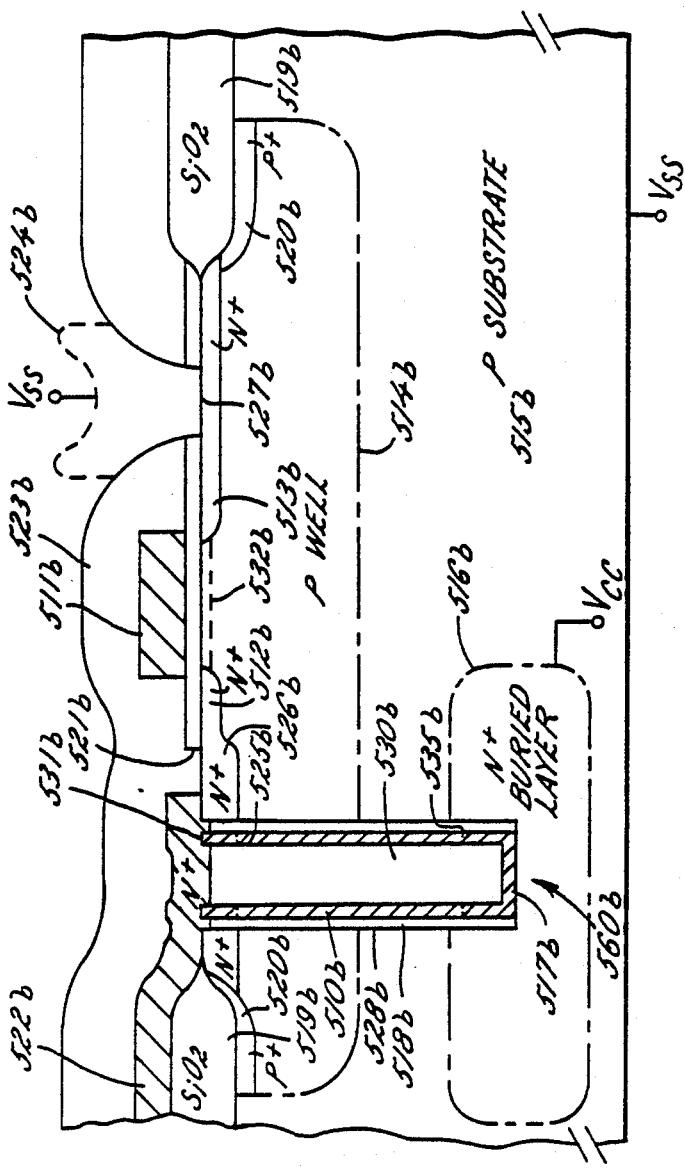
FIG. 5b is a cross sectional view of a second embodiment of a structure utilizing a trench load resistor in accordance with the teachings of this invention.
Figure 5C:
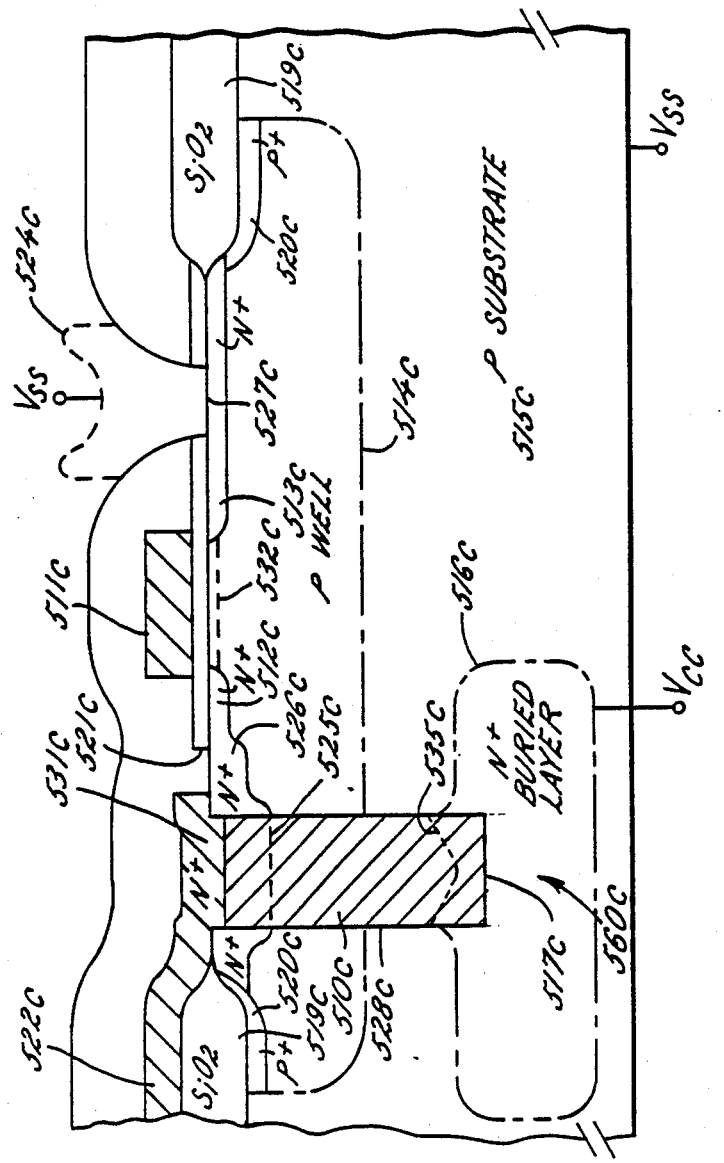
FIG. 5c is a cross sectional view of a third embodiment of a structure utilizing a trench load resistor in accordance with the teachings of this invention.

FIGS. 5a, 5b, and 5c each show a cross-sectional view of a trench resistor in series with a transistor forming an inverter in accordance with three variations of one embodiment of this invention. FIG. 5d shows a schematic diagram depicting the circuit of the structures of FIGS. 5a through 5c.

In FIG. 5a, an NMOS switch transistor includes gate 511a, N+ source diffusion 513a, and N+ drain diffusion 512a. Typically, gate 511a is constructed of N+ doped polycrystalline silicon or a silicide or a refractory metal. Transistor p-channel region 533a is formed inside P well 514a which is formed within P type substrate 515a. Device isolation is provided by oxide 519a and P+ diffusion 520a in the field regions. Drain diffusion 512a is connected through N+ diffusion 526a to vertical polycrystalline silicon resistor 510a confined inside trench 560a whose sidewalls 528a are dielectrically insulated with a thin dielectric film 518a, such as silicon dioxide formed by thermal oxidation of silicon. Bottom 517a of trench 560a extends into N+ buried layer 516a. Buried layer 516a can be formed by diffusion of N type dopants into P substrate 515a and then growing a P type epitaxial layer as the top layer of P substrate 515a, which results in diffusion 516a being a buried diffusion. The depth of trench 560a therefore must be greater than the thickness of such P type epitaxial layer.

Polycrystalline silicon resistor 510a is in direct physical contact with N+ doped buried layer 516a. Polycrystalline silicon load resistor 510a also fills up entirely the cavity of the trench, but its top surface 531a is slightly below the top silicon surface. The top surface of polycrystalline silicon resistor 531a is in direct physical contact with a conductive layer such as N+ doped polycrystalline silicon 522a. This conductive layer may be the same layer as that used to form gate 511a of the transistor, or it may be a separate dedicated layer. Doped layer 522a may also be used to provide direct electrical contact to the gates of adjacent transistors (not shown). It can also be used as a diffusion source to dope N+ both the exposed top silicon surface, forming N+ diffusion 526a, as well as the exposed top edge 531a of polycrystalline silicon resistor 510a. This establishes good electrical contact between drain diffusion 512a and one terminal of the polycrystalline silicon resistor 510a. During high temperature cycles in the manufacturing process, N+ dopants diffuse downwards into the polycrystalline silicon 510a from the top surface 531a, as well as upwards into polycrystalline silicon trench resistor 510a from its bottom surface 517a. The final resistor R extends between diffusion edges 525a and 535a. The polycrystalline silicon filling the cavity of the trench is either undoped (intrinsic) or it is sufficiently lightly doped to provide a very high impedance path across resistor R, typically in the range of $1 \times 10^9$ ohms to $1 \times 10^{12}$ ohms, depending on the depth and diameter of the cavity of trench 560a, as well as the doping concentration of polycrystalline silicon 510a. The diameter of the cavity can be made very small by increasing the thickness of dielectric film 518a so as to partially fill the cavity along its vertical walls. To properly fill the entire cavity of trench 560a, it is important that the thickness of the polycrystalline silicon film as deposited exceed the radius of the trench at its widest opening.

In the embodiment of FIG. 5b, the thickness of the polycrystalline silicon film used to form polycrystalline silicon resistor 510b is independent of the lateral dimensions of trench 560b. This may be the case when extremely high resistance values in the teraohm range are required, necessitating the use of a very thin layer of undoped polycrystalline silicon, perhaps less than 100 nanometers. In this case, the remaining cavity 530b inside trench 560b is filled with dielectric material such as silicon dioxide or silicon nitride formed by Low Pressure Chemical Vapor Deposition (LPCVD). This embodiment may also be used with a variation when a resistor of relatively low resistance value is required. For example, if resistor 510b is a polycrystalline silicon film of thickness 50 nanometers doped N+ so as to have a sheet resistivity of 500 ohms per square, then a trench resistor 510b inside a trench 10 microns deep and 1 micron in diameter can provide a resistance of approximately 1500 ohms. Such low value resistors could be used as highly compact load elements in bipolar logic inverters and memory cells.

In the embodiment of FIG. 5b, electrical contact to the bottom 517b and top 531b surfaces of polycrystalline silicon resistor film 510b is made as in the previous embodiment by direct physical contact with N+ buried layer 516b and N+ doped polycrystalline silicon or silicide 522b, respectively. The length of the vertical resistor (which runs as a hollow cylinder concentric with the inner surface of dielectric layer 518b, which hollow center is filled with, for example, LPCVD silicon dioxide or silicon nitride) extends between diffusion edges 525b and 535b formed by out diffusion into the polycrystalline silicon film from N+ polycrystalline silicon 522b and N+ buried layer 516b, respectively. N+ polycrystalline silicon layer 522b also forms N+ diffusion 526b, and thereby creates a direct electrical contact between resistor 510b and N+ drain diffusion 512b.

Thus, in the embodiment of FIG. 5b, a resistor is formed of a shell of electrically conductive material having its hollow center filled with non-conductive material, such as oxide, or with conductive material of significantly greater resistivity than the polycrystalline resistor film 510b. For example, when a relatively low resistance value is desired, polycrystalline silicon resistor 510b is formed, for example, with polycrystalline silicon of low sheet resistivity, and the core of the trench is then filled with dielectric material or polycrystalline silicon having high sheet resistivity, thereby having minimal influence on the overall resistance value of the trench resistor.

The embodiment of FIG. 5c is very similar to the embodiment of FIG. 5a, except that dielectric layer 518a is omitted and polycrystalline silicon resistor 510c is allowed to make direct physical and electrical contact with vertical wall 528c of trench 560c. A key requirement for trench resistor structure 510c to function properly as a high impedance resistor is that the polycrystalline silicon material filling the cavity of trench 560c be lightly N type doped. This then assures good PN junction isolation between polycrystalline silicon resistor 510c and the surrounding P well 514c and P substrate 515c. This embodiment is somewhat easier to manufacture than embodiments 510a and 510b of FIGS. 5a and 5b because of the latter's additional requirement for sidewall dielectric isolation 518a and 518b, respectively. However, trench resistor 518c of FIG. 5c is more susceptible to increased junction leakage at high temperatures and also to upset by change generated by alpha particle hits in its vicinity. By contrast, trench resistors 510a and 510b of FIGS. 5a, 5b are relatively immune to upset by alpha particle hits because only a very small diffusion junction area 526a, 526b is exposed to charge generated in P well 514a, 514b by the incident alpha particles.

The embodiments of FIGS. 5a, 5b, and 5c have been described in conjunction with NMOS transistor structures. It is possible to form vertical trench resistors also in conjunction with PMOS and bipolar transistor structures, fabricated on an N type epitaxial layer instead of P type substrate 515a, 515b, 515c.

Other variations are possible, resulting for example with intermediate range resistances ($10^2$ ohms to $10^6$ ohms) obtained for the trench resistor. For example, it is possible to first deposit inside the trench a thin layer of undoped polycrystalline silicon of insufficient thickness to fill the cavity. Then the surface of this film is ion implanted at a small angle (e.g. 7° relative to the vertical to the surface of the silicon wafer) to achieve surface doping of the vertical exposed walls of this layer of polycrystalline silicon. Then a second film of either undoped polycrystalline silicon or silicon dioxide is deposited to fill up the cavity inside the trench. Similar results can be obtained by etching the trench walls 528b at a slightly positive angle with respect to the silicon surface, so that the trench diameter at the top silicon surface is perhaps 20–40% greater than the diameter of the trench at its bottom. This provides a sufficient angle of incidence for implanted ions to dope the outer surface of the polycrystalline silicon film deep into the trench, even without having to slant the wafers relative to the ion implantation beam.

Figure 3:
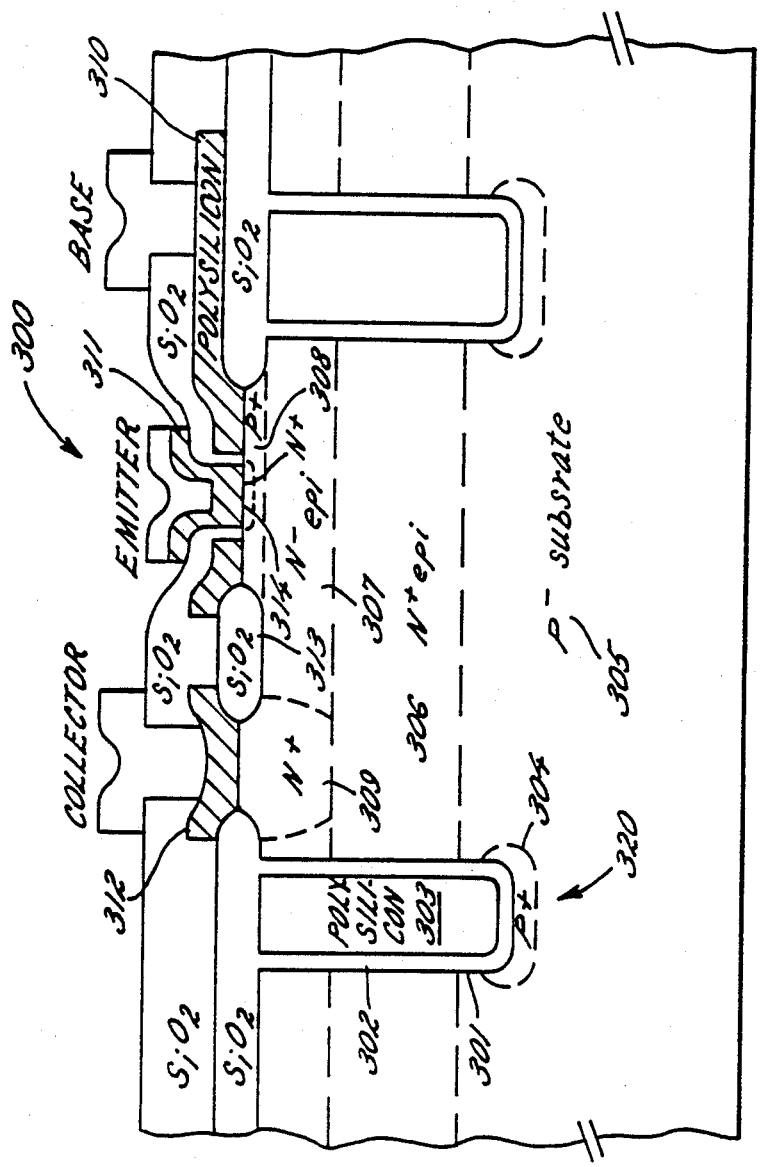
FIG. 3 is a cross sectional view of a prior art trench isolated vertical NPN transistor structure.

In order for one to be able to use the embodiments of FIGS. 5a, 5b, or 5c in a highly compact SRAM cell, it is necessary that the Vcc supply voltage (typically 5 volts) be applied to N+ buried layer 516a, 516b, 516c. If this N+ buried layer is part of an N++ substrate, then the Vcc supply can be applied directly to this substrate from the backside of the chip. Alternately, the N+ layer can be a buried diffusion shared by many trench resistors, and carrying the Vcc supply through a plurality of electrical contacts from the top surface spaced at appropriate intervals to maintain low resistance to the entire buried diffusion. Such electrical contacts can be provided by using N+ diffusions downward from the top surface (similar to diffusion 309 of FIG. 3), or as will be shown below (see Section VI), by using very low resistivity vertical connectors embedded in trenches etched at the same time as the high resistivity trench resistors are etched.

II. SRAM Cell Using High Resistivity Trench Resistor Loads

Figure 1:
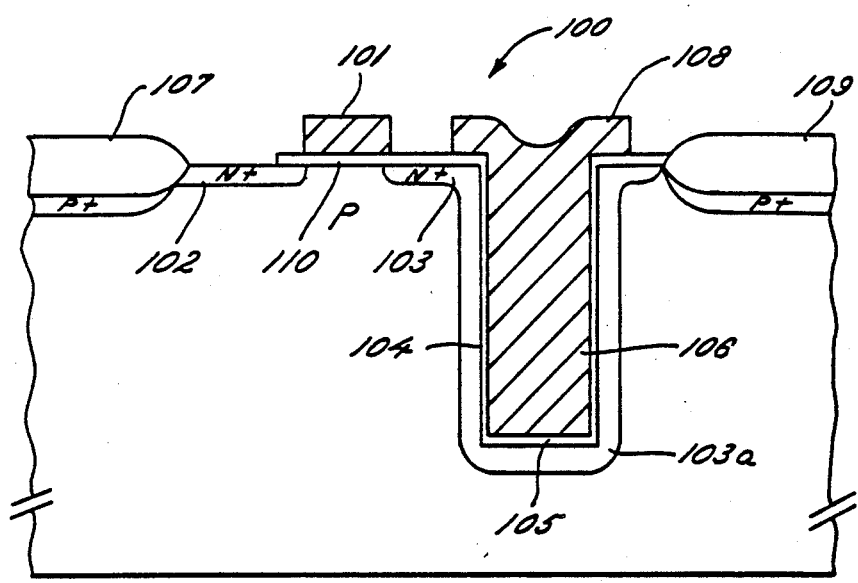
FIG. 1 is a cross sectional view of a prior art DRAM cell with a trench capacitor.
Figure 2A:
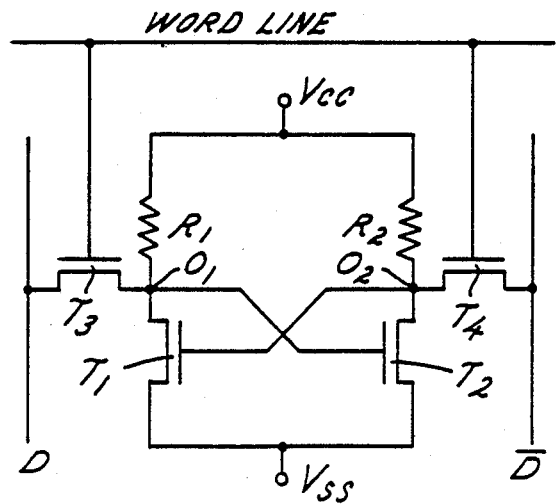
FIG. 2a is a schematic diagram of a prior art SRAM cell with four transistors and two pullup load resistors per cell.
Figure 2B:
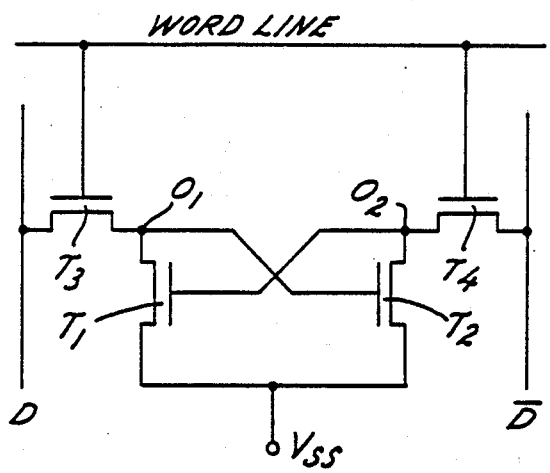
FIGS. 2b is a schematic diagram of a prior art SRAM cell with four transistors and no load resistor.

In accordance with the teachings of this invention, the SRAM cell of FIG. 2a is implemented with four transistors and two trench resistors. One embodiment of such a SRAM cell is shown in the top view of FIG. 6. Switching transistors $T_1$ and $T_2$ share grounded source diffusion 613, where the ground potential Vss is supplied by metal line 624 through via opening 627. Transistor gates 611, 622 are typically made from N+ doped polycrystalline silicon or a low resistivity silicide layer. Drain diffusion 612 of transistor $T_2$ makes electrical contact to gate 622 of transistor $T_1$ as well as to trench resistor $R_2$ (610 in FIG. 6 and 510a in FIG. 5a) through diffusion 626, which is established by a buried contact opening in the gate oxide prior to deposition of transistor gate layers 611, 622. Similarly, drain diffusion 612a of transistor $T_1$ makes electrical contact to gate 611 of transistor $T_2$ as well as to trench resistor R1 (610a) through buried contact opening 626a. Trench resistors $R_1$ and $R_2$ are connected on their buried end to a buried N+ diffusion corresponding to buried layer 516a in FIG. 5a (not shown in FIG. 6) which is buried several microns underneath transistors $T_1$, $T_2$. That buried diffusion is held at Vcc potential through a top surface electrical connection to the Vcc supply (not shown in FIG. 6). Data is stored on nodes $O_1$ (612a) and $O_2$ (612), and is accessed through access transistors $T_3$ and $T_4$, having gates $G_3$, $G_4$ which are part of word line W. When transistors $T_3$ and $T_4$ are turned on, binary data D and $\overline{D}$ can either be read out of or written into the memory cell through metal $\overline{BIT}$ and $\overline{BIT}$ lines 650a and 650 making electrical contact through via openings 649a and 649, respectively.

Figure 6:
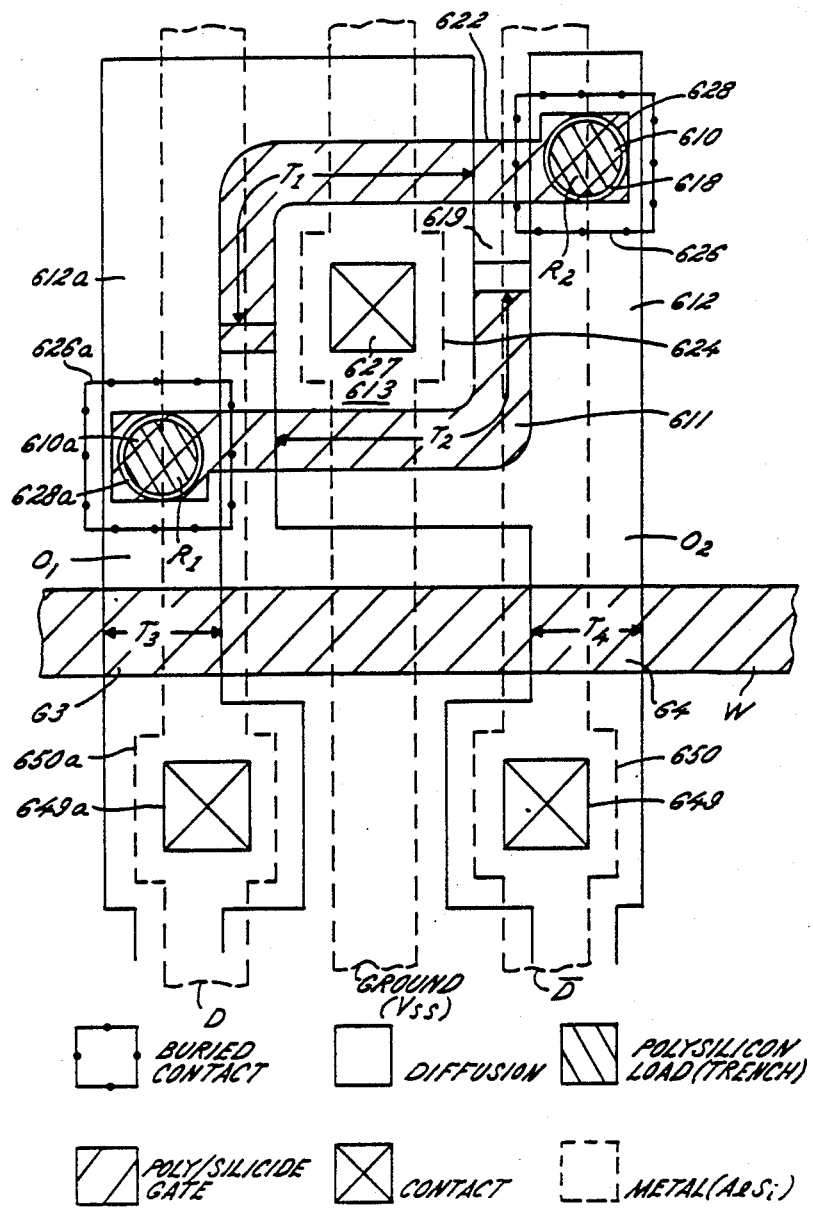
FIG. 6 is a top view of one embodiment of an SRAM cell using four transistors and two trench load resistors according to this invention.

The SRAM cell of FIG. 6 is more compact than prior art SRAM cells which use two high resistivity loads, because the cell of FIG. 6 consumes little if any additional surface area to implement the high resistivity polycrystalline silicon load resistors $R_1$, $R_2$ buried inside vertical trenches. Furthermore, as surface topologies become ever smaller in future generation SRAM's, it is relatively straightforward to scale down the surface area required for trench resistors $R_1$, $R_2$ by simply reducing the diameter or the depth of trenches 628, 628a. Also of importance, use of trench resistors $R_1$ and $R_2$ in the SRAM cell of FIG. 6 allow the surface of the device to be relatively flat while requiring only a single layer of polycrystalline silicon to serve as electrical interconnects and gate electrodes.

III. Process Flow for Fabricating High Resistivity Trench Resistors

Several process flows are possible to fabricate the structures of FIGS. 5a, 5b, 5c, and the SRAM cell of FIG. 6. The salient features of one such process flow are now described in relation to the structure of FIGS. 5a, 7a, and 7b, with similar numbering sequence used in each Figure. The discussion below is limited only to the process steps specific to the formation of the trench resistors. Such process steps can be incorporated in any CMOS, NMOS, BICMOS, or bipolar processes.

1. Referring to FIG. 5a, N+ diffusion 516a is formed two to ten microns below the top silicon surface. This may be a buried diffusion formed by diffusion of arsenic into P substrate 515a followed by growing of an epitaxial layer of P type silicon to the required thickness. Alternatively, this N+ diffusion may be part of an N++ substrate, in which case a P type epitaxial layer is grown to the required thickness to serve as a P well.

2. 520a, 519a are formed by standard isoplanar oxidation.

3. Masking oxide 780 (FIG. 7a) of thickness approximately 2000 Å is grown thermally or deposited.

Figure 7A:
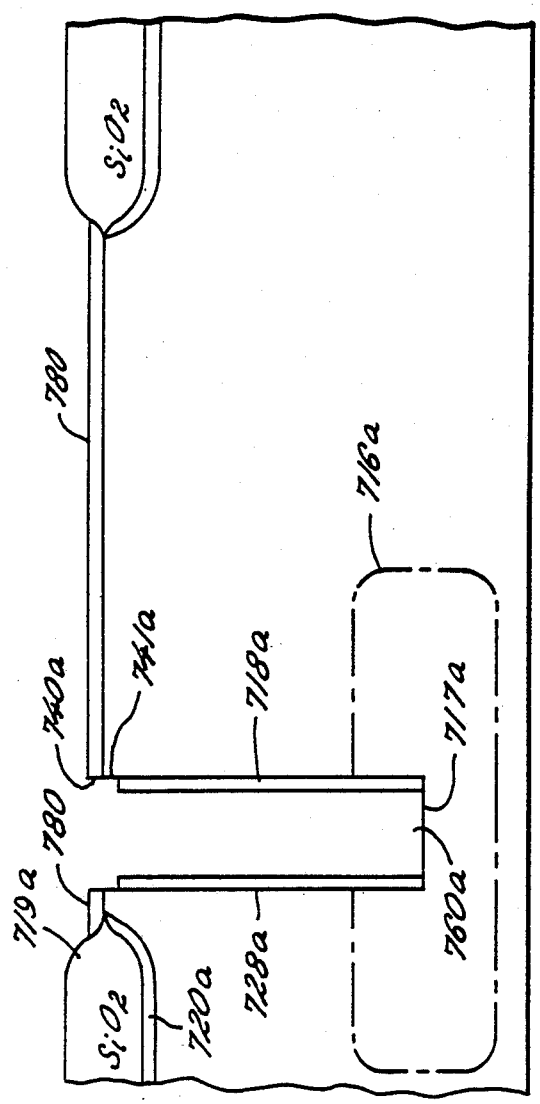
FIG. 7a is a cross sectional view of the trench of FIG. 5a during the manufacturing process.

4. Photoresist is spun and a first masking step is used to define trench opening 740a in masking oxide 780 (FIG. 7a). The exposed portion of masking oxide 780 is etched to the surface of the silicon and the photoresist is stripped.

5. Vertical trench 760a is etched by reactive ion etching to a depth sufficient to ensure penetration of the trench well into N+ buried layer 716a. The reactive ion etching process has a good etch rate selectivity between masking oxide 780 and silicon, therefore leaving approximately 1000 Å of masking oxide 780.

6. A thin silicon dioxide layer 718a (20 nanometers to 100 nanometers thickness) is grown thermally or deposited by chemical vapor deposition to cover exposed surface 728a of the sidewalls and bottom of trench 760a. To further improve this insulation, it can be capped by a second thin layer of silicon nitride (not shown).

7. A short anisotropic reactive ion etchback of the deposited thin insulators (silicon nitride and/or silicon dioxide) results in removal of this insulating film from the top surface of the silicon as well as from the bottom of trench 760a, leaving thin insulator 718a only on sidewalls 728a of trench 760a, while the top silicon surface remains protected by masking oxide 780. Buried diffusion 716a is now exposed at the bottom of trench 760a, at surface 717a. A small surface 741a of the silicon at the top circumference of trench 760a also becomes exposed by this etchback step.

Figure 7B:
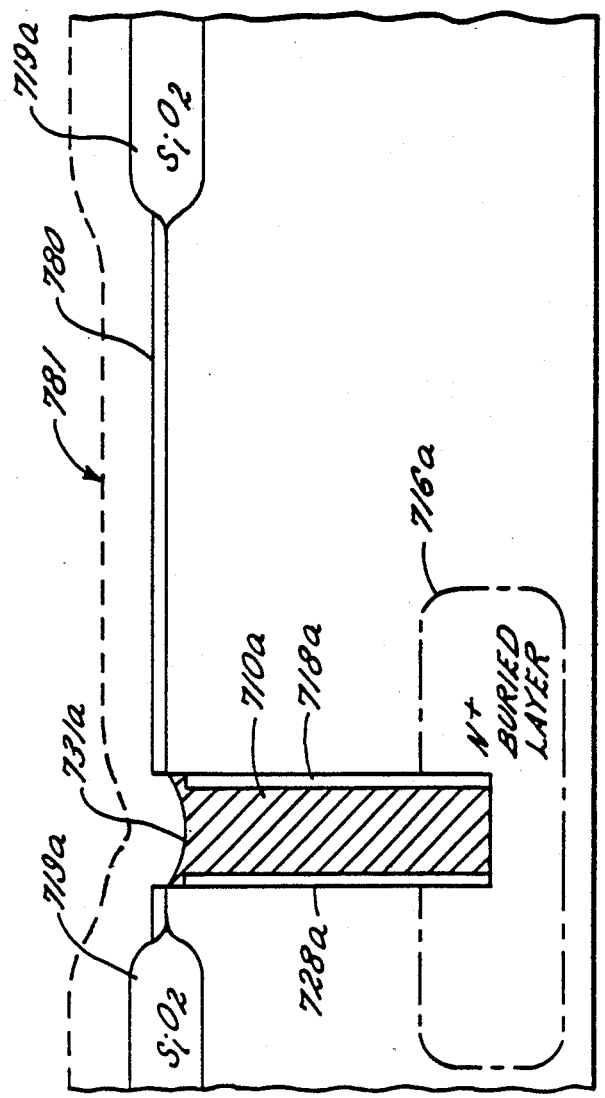
FIG. 7b is a cross sectional view of the trench of FIG. 5a during a subsequent step in the manufacturing process.

8. As shown in FIG. 7b, layer 781 of undoped polycrystalline silicon is now deposited by low pressure chemical vapor deposition. The thickness of this layer must be greater than the radius of trench 760a so as to completely fill the cavity of trench 760a with this polycrystalline silicon. For a 1.0 micron diameter trench, a polycrystalline silicon film of approximately 600-700 nanometers thickness is required.

9. An anisotropic reactive ion etchback of polycrystalline silicon is now performed, resulting in removal of the polycrystalline silicon layer from the top surface but not from inside the trench, and stopping at masking oxide 780 protecting the top surface. FIG. 7b shows the top surface of the polycrystalline silicon film before (dashed line 781) and after (731a) this etchback.

At the completion of this step, a vertical undoped polycrystalline silicon resistor 710a resides inside trench 760a, in physical contact with N+ buried layer 716a and insulated from the trench sidewalls 728a by insulation 718a.

10. Masking oxide 780 is now etched away with buffered hydrofluoric acid, leaving the top silicon surface exposed except under isolation oxide 719a.

11. P channel and N channel implants are now performed in selected areas to obtain the desired transistor threshold voltages. A thin gate oxide is thermally grown (thicknesses typically between 15 and 30 nanometers).

12. Photoresist masking (not shown) is used to expose buried contact openings in gate oxide 521a in FIG. 5a (also inside of area 626 of FIG. 6). The exposed oxide is etched to clear the silicon surface as well as top surface 731a of trench resistor 710a. The photoresist is stripped and the surface cleaned.

13. A conductive layer is deposited to form the transistor gate material (511a in FIG. 5a) as well as the interconnect material 522a connecting to the top surface 531a of the trench resistor. This layer may be N+ doped polycrystalline silicon, or a low resistivity silicide such as tungsten silicide, or a refractory material such as molybdenum. In the case of an N+ doped polycrystalline silicon, the phosphorous or arsenic dopant from this layer penetrates the exposed surface of silicon in the buried contact opening and forms an N+ junction (526a in FIG. 5a). In subsequent high temperature steps, diffusion down from N+ layer 522a into the trench resistor and diffusion up from N+ buried layer 516a causes this resistor to be doped N+ at its two edges, 525a and 535a, respectively.

14. A masking step (not shown) is used to define and etch gates and interconnects in the conductive layer.

15. The remainder of the processing is conventional, resulting in formation or source/drain diffusions 513a, 512a, isolation layer 523a, via openings 527a, and metal interconnects 524a. The resulting structure is the one shown in FIG. 5a.

The structure of FIG. 5b can be formed using the same process steps except for slightly different steps 8 and 9:

Step 8: A thin layer between 50 nanometers and 200 nanometers of undoped polycrystalline silicon is deposited. This thickness is insufficient to fill the entire cavity of the trench. The remaining space inside the cavity is now filled with an oxide dielectric (can be TEOS oxide or LPCVD oxide). The top surface now has a top layer of approximately 400 nanometer oxide covering the layer of undoped polycrystalline silicon.

Step 9 (for structure 510b): The top layer oxide is anisotropically etched back by reactive ion etch to clear the top surface of undoped polycrystalline silicon, leaving unetched the oxide filler inside the trench. The exposed undoped polycrystalline silicon is now etched back anisotropically, stopping at the layer of masking oxide 780.

The remaining process is the same as the previously described steps 10 through 15.

The structure of FIG. 5c can be formed by omitting process steps 6 and 7 while performing all other steps 1 through 15.

In all these process variations, only two additional masking steps are required to form the trench resistors, one mask to define the trench, the other to define the buried contact. This is one masking step less than that required to form standard polycrystalline silicon load resistors in prior art devices.

IV. Very Low Resistivity Trench Connectors to Buried Diffusions

Figure 4:
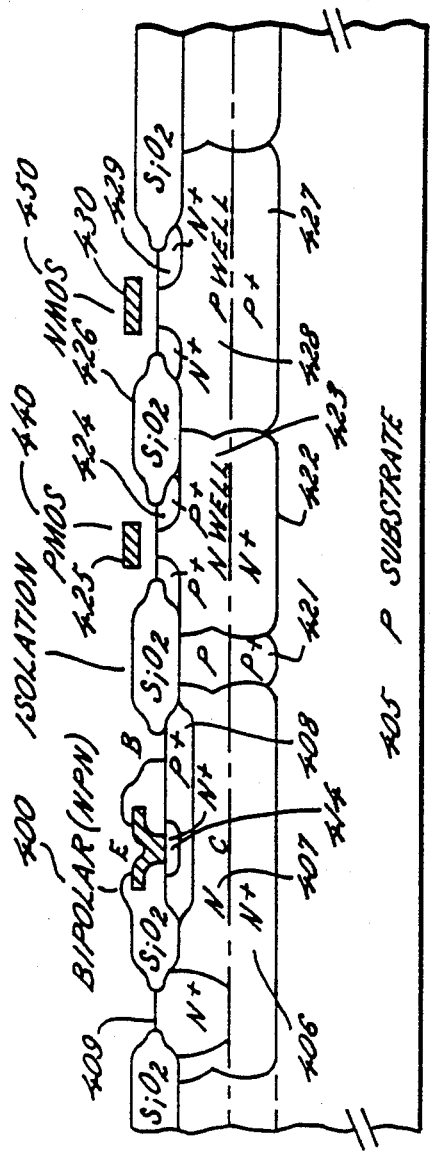
FIG. 4 is a cross sectional view of a prior art BICMOS structure.

FIG. 4 shows in cross section a BICMOS structure having a vertical bipolar NPN transistor 400 formed adjacent to PMOS transistor 440 and NMOS transistor 450. N+ buried diffusion 406 is the low resistivity collector of NPN transistor 400. N+ buried diffusion 422 is used to provide a low resistivity substrate contact for N well substrate 423 of PMOS transistor 440 while P+ buried diffusion 427 serves the same purpose for P well 428 of NMOS transistor 450. In addition, buried diffusions 421, 422 and 427 are used to achieve good device isolation and substantially reduce the likelihood of bipolar SCR latchup. Typically, N+ buried diffusions 406 and 422 are contacted from the top surface by diffusing N+ regions 409 in a long, high temperature downward diffusion from the top surface all the way down to the buried layer. P+ buried layers 427, 421 can be held at the ground potential of P type substrate 405, but this is not always an ideal situation because substrate 405 may itself experience voltage bumps or have localized voltage glitches during high current switching.

Accordingly, it is advantageous to have the flexibility to electrically contact each of the buried diffusions 406, 422, 427 from the top surface through low resistivity interconnections.

Figure 8:
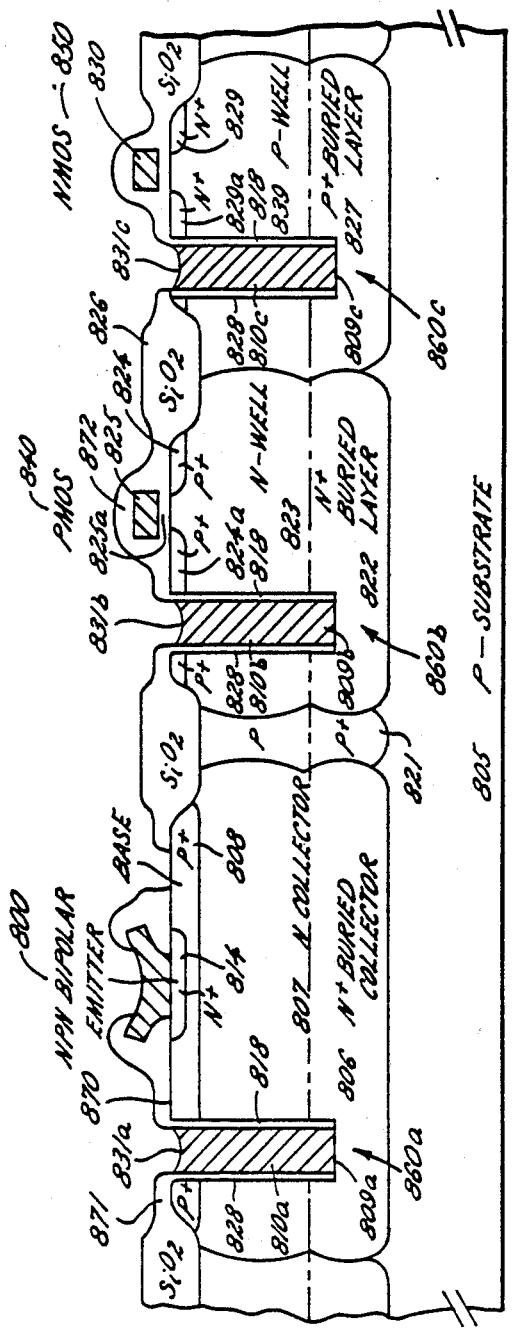
FIG. 8 is a cross sectional view of one embodiment of a BICMOS structure with low resistivity trench connectors to buried diffusions in accordance with this invention.

One embodiment of this invention allows the formation of such a vertical low resistivity interconnection inside the cavity of a trench etched into the silicon and stopping well inside the specific buried diffusion layers. FIG. 8 shows in cross section a BICMOS structure of such an embodiment. In this embodiment N+ buried layers 806, 822 and P+ buried layer 827 are contacted by vertical interconnects 810a, 810b and 810c, respectively. These interconnects fill entirely the cavity inside their trenches and are electrically isolated from the vertical walls 828 of each trench by their dielectric layers 818. Each trench has an aperture with diameter as small as 0.5 micron or as large as two microns. The bottom surface 809a, 809b, 809c of each trench has this thin dielectric removed prior to filling the cavity of the trench with interconnect material 810a, 810b, 810c.

The interconnect material is chosen to satisfy the following conditions: (a) it should deposit conformally on the inside walls of the trench, (b) it should have relatively low sheet resistivity and be able to make a low resistivity or ohmic contact with the doped silicon in the buried layer, and (c) it should be able to withstand subsequent high temperature process steps. For example, N+ doped polycrystalline silicon can be used as the interconnect material when only N+ buried layers are contacted.

An even better interconnect material is a layer of silicide or a thin layer of polycrystalline silicon covered with a layer of silicide (this sandwich structure is commonly referred to as polycide). Such materials can be deposited with good conformality and have sheet resistivity lower by one order of magnitude than that of heavily doped polycrystalline silicon. Furthermore, silicides can form low resistivity electrical contacts to both N+ and P+ doped silicon and are therefore highly suitable for simultaneously contacting all the buried layers of the structure of FIG. 8. Some of these silicide materials also have the desirable property that they can be deposited selectively only on areas where the surface of silicon is exposed, as is the case for the bottom surfaces 809a, 809b, 809c of each of the trenches. Ohba et al., "Selective CVD Tungsten Silicide for VLSI Applications", *Technical Digest of the 1987 International Electron Devices Meeting*, p. 213, describes the use of selective CVD of tungsten silicide inside via openings. Ohba et al. shows that the contact resistance of CVD tungsten silicide ($WSi_x$) to both N+ and P+ doped silicon is approximately the same as that of an aluminum/silicon alloy. Therefore, using trench interconnect 810a to contact N+ buried collector 806 has the same low electrical resistivity as would be the case if an aluminum/silicon . alloy could be brought directly in contact with the buried collector. This can reduce the effective collector resistance by as much as one order of magnitude, which is important in high speed applications.

In the structure of FIG. 8, each of the trench interconnects can be contacted from the top surface by a via opening in the top insulation layer (not shown) and directly contacting the exposed top surfaces 831a, 831b, 831c with an aluminum/silicon alloy interconnect layer (also not shown).

Although the structure of FIG. 8 shows each trench completely filled with the interconnect material, it is of course also possible to use a thinner interconnect layer which will not completely fill the cavity of the trench. In that case (much in the same way as the structure of FIG. 5b), the remaining cavity of the trench can be filled with a dielectric filler such as LPCVD or plasma enhanced CVD silicon dioxide or silicon nitride.

Also, although the trench interconnects shown in the structure of FIG. 8 are electrically isolated from shallow diffusions 808, 824a, 829a, in accordance with the teachings of this invention, isolation can be removed between the trench interconnect and diffused regions to establish direct physical and electrical contact between any one of these diffusions and the interconnect material 810a, 810b, 810c. In some embodiments, the trench interconnect layer also serves as a surface interconnect or even as the transistor gates 830, 825 of NMOS and PMOS transistors 850 and 840, respectively. In such an embodiment, the interconnect material fills the trench cavity and also covers the top surface over gate oxide 825a. A masking and etch step then defines gates 825, 830 at the same time as protecting from etching the trench interconnect areas 831a, 831b, 831c.

The processing steps required to achieve the trench interconnects in the structure of FIG. 8 are similar in nature to steps 1 through 15 described previously in conjunction with the structures of FIGS. 5a, 5b, 5c. Alternatively, because no high temperature diffusion steps are required, it is also possible to introduce the specific process steps very late in the manufacturing flow, after all other diffusion layers such as 814, 808, 807, 806, 824, 823, 822, 829, 839, and 827, as well as all gates 825, 830 have already been formed. This can be accomplished with the following sequence of process steps relating to the structure of FIG. 8:

1. Dielectric layer 871, 872 is deposited to a thickness of approximately 400 nanometers. This layer can, for example, be Borophosphorosilicate glass (BPSG).

2. A masking step is used to define circular or rectangular openings in dielectric 871, 872 where trench interconnects 810a, 810b, 810c are to be formed. The exposed dielectric is etched to clear top silicon surface 870, and the photoresist is removed.

3. Anisotropic reactive ion etching is used to etch trenches 860a, 860b, 860c into the silicon to the depth required to penetrate buried layers 806, 822, 827, using the remaining portions of dielectric 871, 872 as an etch shield for the rest of the structure.

4. The walls 828 of the trenches are coated with dielectric insulation 818 by thermal oxidation or chemical vapor deposition of silicon dioxide or silicon nitride (or a sandwich of both).

5. Anisotropic reactive ion etching is used to remove dielectric 818 only from the bottom surface of each trench 860a, 860b, 860c, exposing the silicon surface 809a, 809b, 809c of the buried layers.

6. Trenches 860a, 860b, 860c are filled with the low resistivity interconnect material 810a, 810b, 810c. This may be a selective deposition process, in which case only the trenches are filled, with no interconnect material deposited on the top surface of dielectric 871, 872. In the case of non-selective deposition, trenches 860a, 860b, 860c are filled and a layer of interconnect material covers the top surface. In this case, reactive ion etchback of the interconnect material can remove any of this interconnect layer from the top surface, leaving it only within the trenches, with top surfaces 831a, 831b, 831c exposed. Alternatively, a masking step is used to define interconnect lines in this conductive layer and to etch away any unwanted top surface conductive paths between adjacent trenches.

7. The exposed top surfaces of all trench interconnects or top surface conductors are now coated with a thick isolation layer such as phosphorous doped glass or plasma enhanced chemical vapor deposited silicon nitride. This layer may be flowed or otherwise planarized to form a top surface with relatively smooth topography (not shown).

8. Contact openings are defined and vias are etched in the thick isolation layer to achieve electrical contact through a metal interconnect layer (not shown) on the top surface of the device to any of trench interconnects 801a, 801b, 801c as well as to any other surface diffusions to which contact to the trench interconnect is desired.

The remaining steps in the process are standard. This process sequence has the same number of masking steps as is required in the standard BICMOS process flow.

V. Very Low Resistivity Trench Connectors to a Low Resistivity Substrate

Figure 9:
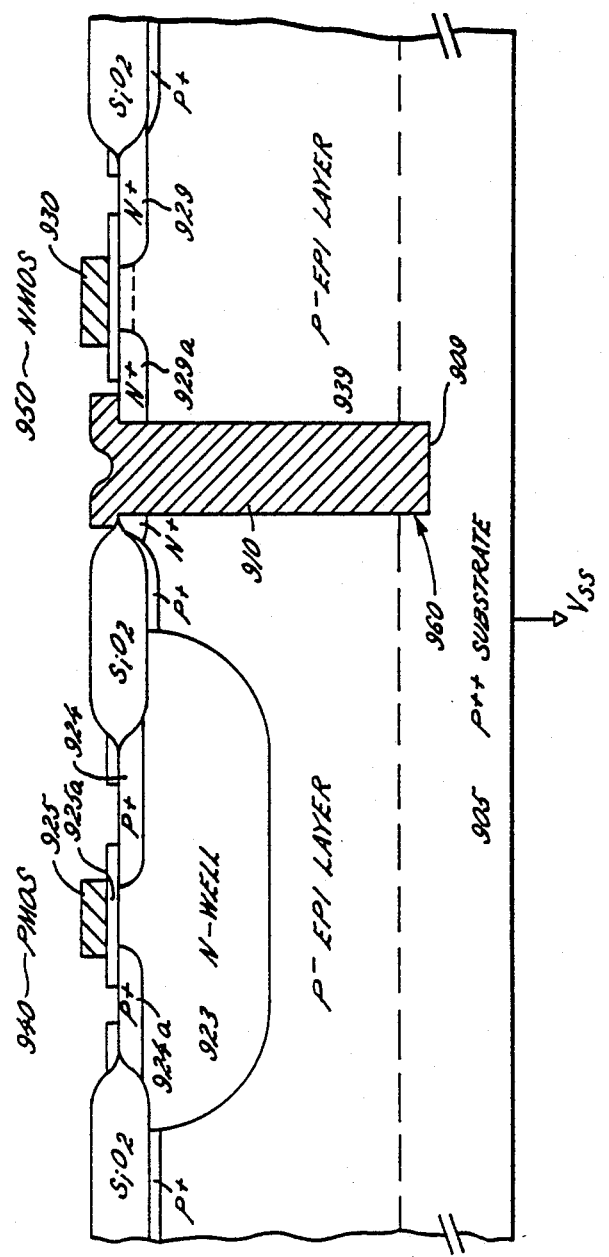
FIG. 9 is a cross sectional view of a CMOS structure with low resistivity trench connectors to a low resistivity substrate in accordance with this invention.

Although the structure of FIG. 8 makes it possible to electrically access buried diffusions 806, 822, 827 from the top surface, the reverse is also true. In other words, it is also possible to use the low resistivity trench interconnect structure of this invention to supply a substrate potential from a heavily doped low resistivity substrate to any top surface shallow junction. The partially complete CMOS structure shown in cross section in FIG. 9 illustrates such an approach. PMOS transistor 940 and NMOS transistor 950 are formed in a P type epitaxial layer 939 grown on a heavily P++ doped substrate 905. N well 923 is formed by diffusion of phosphorous into P type epitaxial layer 939. The substrate potential for NMOS transistor 950 is provided from P++ substrate 905, which is permanently tied to the ground potential Vss. Source diffusion 929a of NMOS transistor 950 is normally also held at ground potential. In the prior art, this is accomplished either by strapping every N+ source diffusion to P type epitaxial layer 939 through an adjacent P+ diffusion (not shown in FIG. 9) or through a metal ground line (Vss supply) on the surface of the device making electrical contact to the N+ source.

In the present invention, vertical trench 960 of narrow circular or rectangular aperture is etched through N+ source diffusion 929a and through P type epitaxial layer 939 to reach into P++ substrate 905. Trench 960 is then filled with a low resistivity interconnect material 910 such as Tungsten Silicide through, for example, selective CVD of $WSi_x$ on the silicon surfaces inside trench 960. It is important that all other top surface areas on the wafer are protected with, for example, an oxide layer to prevent undesired deposition of CVD $WSi_x$. Any interconnect remaining on the top surface can be etched back, as previously described.

There are several advantages to the structure of FIG. 9:

(a) There is no area penalty, as there is for strapped substrate contacts.

(b) There is no need for metal power lines running across the surface of the device to connect the ground supply to remote parts of the device. In this embodiment, all areas of the device have equal access to the substrate ground supply. This can also be used to advantage where certain parts of a circuit (such as sense amplifiers which are particularly sensitive to ground supply voltage bumps) can be provided a separate ground voltage through top surface metal power lines while the rest of the circuit has its ground supplied through the substrate.

(c) Instead of trenches of circular cross section, low resistivity vertical column 910 held at Vss potential can also be constructed in a long narrow wall separating (and thus electrically isolating) long rows of PMOS and NMOS devices (as is the case in CMOS gate arrays), or separating between various sectors of an integrated circuit such as completely surrounding a memory array to electrically isolate it from all periphery logic circuitry. This low resistivity wall inside the trench extends all the way from the top surface of the silicon to the P++ substrate. Because the low resistivity wall has extremely short minority carrier lifetime there is almost no possibility for any minority carriers generated in the P type epitaxial layer 939 on one side of this wall to penetrate through to the other side 940. This provides for circuits with extreme immunity to SCR latchup or to upset by transient ionizing radiation. The walls also can provide excellent uniformity of substrate potential distribution across large chips. It should be noted that the low resistivity trench isolation walls can be formed late in the manufacturing process, and do not add significantly to the overall process complexity. Therefore, they can find good use to effectively isolate electrically noisy segments of large chips.

VI. SRAM Cell With High Resistivity Trench Resistor and Low Resistivity Trench Interconnects In Sections I and II, a SRAM cell employing vertical trench polycrystalline silicon load resistors was described. It was pointed out in Section I that N+ buried diffusion 516a, 516b, 516c (FIGS. 5a, 5b, 5c, respectively) must be contacted to the Vc power supply using a plurality of electrical contacts spaced at appropriate intervals to maintain low resistance. This electrical contact can be achieved using low resistivity trench interconnects of the type described in Section IV or minor deviations thereto. An example of such a structure is shown in cross section in FIG. 10.

Polycrystalline silicon trench resistor 1610 is identical to structure 510b shown in FIG. 5b. Low resistivity trench interconnect 1650 is formed in an adjacent trench to provide the Vcc supply to N+ buried layer 1616 from the top surface through conductive layer 1622a.

Both low resistivity and high resistivity structures can be achieved in a single process flow which is a minor deviation to the process steps 1 to 15 described in Section III. Specifically, the following process flow can be employed:

Steps 1 through 7: Same as steps 1 through 7 in Section III, above. At this stage, both trenches are etched to the same depth into the N+ buried layer, both have their sidewalls 1628, 1628a covered with thin dielectric insulation layer 1618, 1618a and their bottom surfaces 1617, 1617a exposed to the N+ silicon of buried layer 1616.

Step 8(b): Deposit approximately 200 nanometers (or approximately one quarter the aperture diameter of the trench) of undoped LPCVD polycrystalline silicon into both trenches. Fill the remaining cavity (1630 in FIG. 10) with a conformal dielectric, such as TEOS oxide or LPCVD $SiO_2$. The top surface now has approximately 400 nanometers of oxide covering the layer of undoped polycrystalline silicon.

Step 9(b): Etchback the top oxide by anisotropic reactive ion etching, stopping at the layer of undoped polycrystalline silicon.

Step 10(b): Apply a layer of photoresist on the surface of the device and form an opening over trench 1650. Wet etch dielectric 1630a filling the cavity in trench 1650. Strip the photoresist.

Step 11(b): Etchback the exposed polcrystalline silicon by anisotropic reactive ion etching. This etch removes the top layer of undoped polycrystalline silicon as well as the polycrystalline silicon at the bottom of trench 1617a, since this polycrystalline silicon is no longer covered with the TEOS oxide filler.

The remaining steps can be essentially the same as steps 10 through 15 of Section III, above. In particular, conductive layer 1622 forms electrical contact to trench resistor 1610 while conductive layer 1622a fills cavity 1630a and forms a low resistivity path to buried layer 1616.

VII. Bipolar Inverter With Trench Resistor Load

Figure 10:
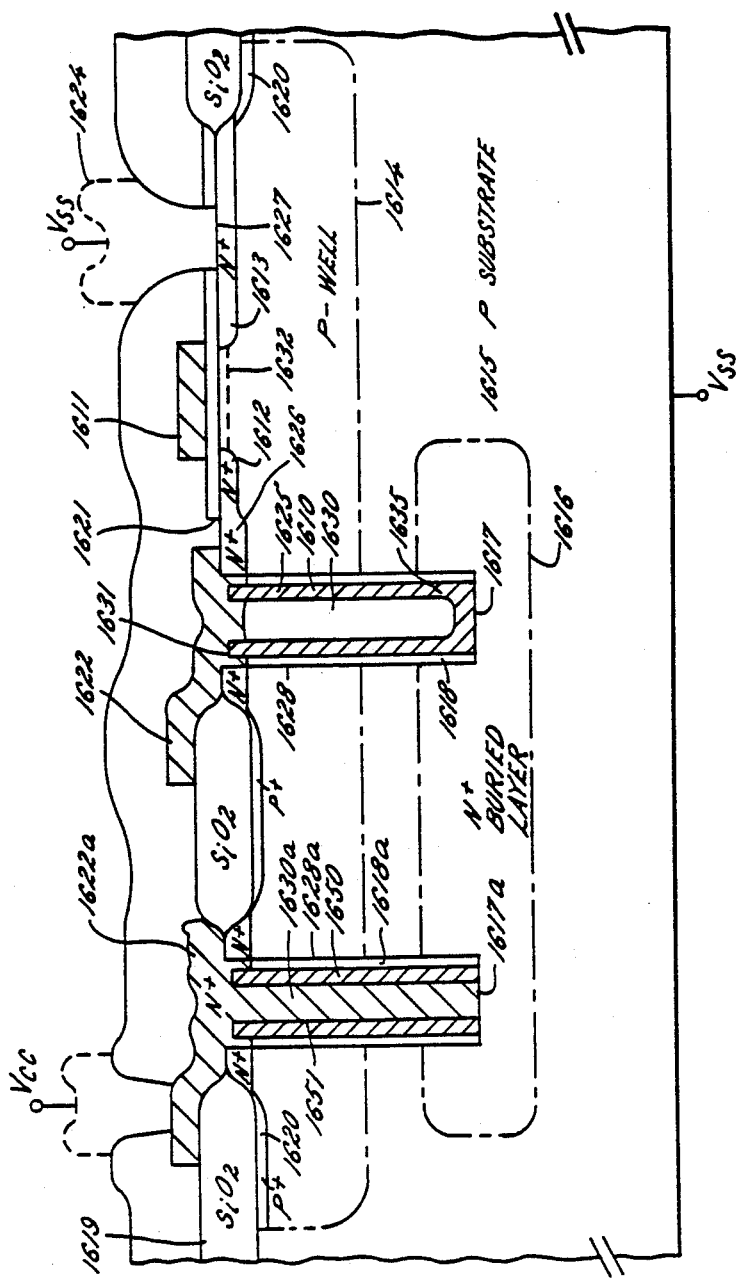
FIG. 10 is a cross-sectional view of one embodiment of a structure combining both a high resistivity trench resistor and a low resistivity trench connector in accordance with this invention.

The structure shown in FIG. 10 can be used with minor modifications to provide very compact resistors of low to medium resistivity (approximately 100 ohms to 2000 ohms) to be used as pullup load elements in bipolar logic inverters. The required process modification is to implant trench resistor 1610 (see FIG. 10) to the desired resistivity level prior to filling cavity 1630 with dielectric filler. If the bipolar switching transistor is a vertical NPN with a buried collector, then two adjacent N+ buried layers 1616 can be used, one to provide the Vcc supply to the trench resistor, the other to provide the low resistivity buried collector. Each of these buried layers can be contacted individually using two separate low resistivity trench interconnections such as 1630a.

Figure 11C:
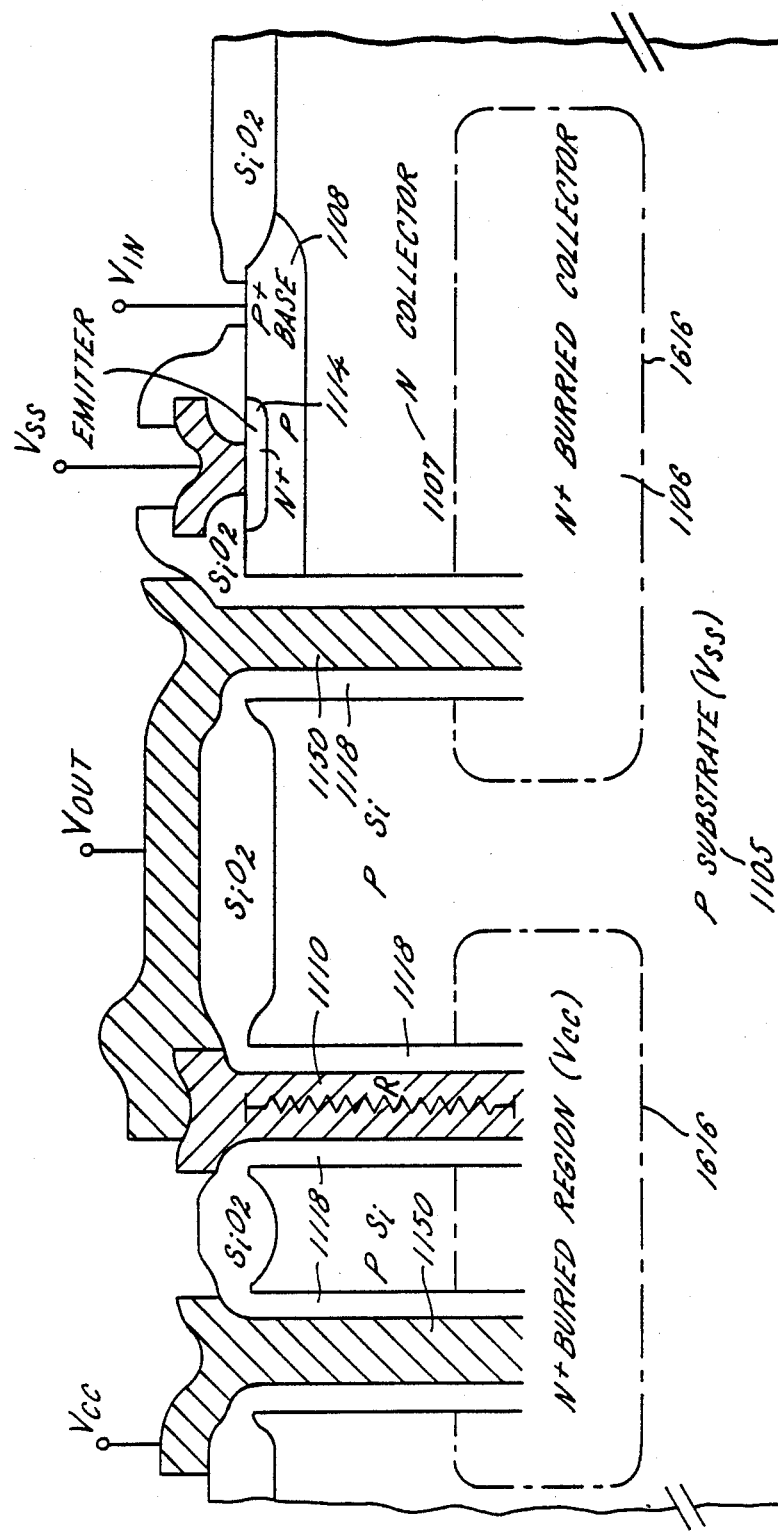
FIG. 11c is a cross sectional view of another embodiment of a bipolar inverter employing vertical trench resistor and trench interconnect structures in accordance with the teachings of this invention.

The structure shown in cross section in FIG. 11a is another embodiment of a compact bipolar inverter. A schematic diagram of the same structure is shown in FIG. 11b. The bipolar NPN switching transistor 1100 has an emitter 1114 connected to the Vss supply, a base 1108 connected to the input terminal Vin and an N type collector 1107 connected to an N+ buried diffusion 1106 in a P substrate 1105. The N+ buried diffusion 1106 is connected to a medium resistivity (approximately 50 to 10,000 ohms) load trench resistor R (1110) which is connected at its top surface 1122 to the Vcc supply. The same N+ buried collector is also connected through a low resistivity (typically less than 10 ohms) trench connector 1150 to the output terminal Vout. The vertical walls of both trenches are isolated with dielectric film 1118. In order to make resistor R higher than 100 ohms for very shallow structures where the N+ buried diffusion is only 1 to 2 microns deep, it is necessary to make the aperture diameter of trench 1160 very narrow, typically no more than 1.0 to 1.5 microns wide. This can be accomplished by increasing the thickness of dielectric film 1118, which therefore decreases the diameter of the cavity inside the trench.

While the process steps described in this invention for the various embodiments are believed to be the most preferred approach to implement, other alternative process flows or different materials can equally be used to achieve a similar end result. Any of the various embodiments described herein can be used in any combination as part of an integrated process, or can be used in a different manner than that described in this invention. For example, the low resistivity trench interconnects described in sections IV or V can also be used to surround the circumference of individual devices or to surround blocks of transistors of equal polarity to create good electrical isolation from adjacent devices of blocks of devices. Also, it is possible to form a good barrier metal contact at the bottom surface of the low resistivity trench interconnect prior to deposition of the interconnect material.

All publications and patent applications are herein incorporated by reference to the same extent as if each individual publication or patent application was specifically and individually indicated to be incorporated by reference.

The invention now being fully described, it will be apparent to one of ordinary skill in the art that many changes and modifications can be made thereto without departing from the spirit or scope of the appended claims.

What is claimed is:

1. A trench interconnection structure comprising:
   a layer of semiconductor material having a top surface, said layer formed of semiconductor material of first conductivity type;
   a buried region spaced apart from said top surface of said layer of semiconductor material;
   a trench having an aperture at said top surface of said layer of semiconductor material and also having essentially vertical sidewalls extending into said layer of semiconductor material and into said buried region; and
   interconnect material of a second conductivity type opposite said first conductivity type located within said trench and in contact with said layer of semiconductor material along at least a portion of said vertical sidewalls, and having a top surface near said top surface of said layer of semiconductor material, said interconnect material forming a vertical trench electrical interconnection between said top surface of said interconnect material and said buried region.

2. A trench interconnection structure comprising:
   a layer of semiconductor material having a top surface, said layer formed of semiconductor material of first conductivity type;
   a buried region spaced apart from said top surface of said layer of semiconductor material;
   a trench having an aperture at said top surface of said layer of semiconductor material and also having essentially vertical sidewalls extending into said layer of semiconductor material and into said buried region;
   interconnect material located within said trench and in contact with said layer of semiconductor material along at least a portion of said vertical sidewalls, and having a top surface near said top surface of said layer of semiconductor material, said interconnect material forming a vertical trench electrical interconnection between said top surface of said interconnect material and said buried region; and
   a layer of insulating material covering said vertical sidewalls of said trench, wherein said insulating material does not cover said buried region and said top surface at said aperture.

3. A trench interconnection structure as in claim 1 wherein said aperture of said trench is less than 2 microns across at its widest point and the depth of said trench is between 1 and 10 microns.

4. A trench interconnection structure as in claim 1 wherein said layer of semiconductor material comprises silicon.

5. A trench interconnection structure as in claim 1 which further comprises a semiconductor substrate, and said buried region is formed within said semiconductor substrate and more heavily doped than said semiconductor substrate, and wherein said layer of semiconductor material comprises an epitaxial layer formed on said semiconductor substrate.

6. A trench interconnection structure as in claim 5 wherein said epitaxial layer is formed on said semiconductor substrate after the formation of said buried region.

7. A trench interconnection structure as in claim 1 which further comprises a semiconductor substrate, at least a portion of which serves as said buried region, and wherein said layer of semiconductor material comprises an epitaxial layer formed on said semiconductor substrate.

8. A trench interconnection structure as in claims 1 or 2 wherein said interconnect material comprises polycrystalline silicon.

9. A trench interconnection structure as in claim 8 wherein said polycrystalline silicon is undoped or lightly doped, thereby having a high resistivity.

10. A trench interconnection structure as in claim 9 wherein said polycrystalline silicon serves as a resistor.

11. A trench interconnection structure as in claim 1 wherein said interconnect material is formed in a layer covering said sidewalls of said trench, further comprising a filler material within the portion of said trench not covered by said interconnect material.

12. A trench interconnection structure as in claim 11 wherein said filler material has a higher resistivity than said interconnect material.

13. A trench interconnection structure as in claim 12 wherein said interconnect material comprises undoped polycrystalline silicon, doped polycrystalline silicon, or polycrystalline silicide, and said filler material comprises doped polycrystalline silicon, undoped polycrystalline silicon, silicon dioxide, or silicon nitride.

14. A very high resistivity trench resistor structure as in claim 8 wherein the electrical resistance between said top surface of said interconnect material and said buried region is between approximately $1 \times 10^6$ and $1 \times 10^{12}$ ohms.

15. A very high resistivity trench resistor structure as in claim 11 wherein the electrical resistance between said top surface of said interconnect material and said buried region is between approximately $1 \times 10^6$ and $1 \times 10^{12}$ ohms.

16. A medium resistivity trench resistor structure as in claim 8 wherein said interconnect material is more heavily doped so as to reduce the electrical resistance between said top surface of said interconnect material and said buried region to between approximately 50 and $10^4$ ohms.

17. A medium resistivity trench resistor structure as in claim 11 wherein said interconnect material is heavily doped so as to reduce the electrical resistance between said top surface of said interconnect material and said buried region to between approximately 50 and $10^4$ ohms.

18. A very low resistivity trench connector structure as in claims 1 or 2 wherein said interconnect material comprises a low resistivity material.

19. A very low resistivity trench connector structure as in claim 11 wherein said interconnect material comprises a low resistivity material.

20. A very low resistivity trench connector structure as in claim 11 wherein said interconnect material comprises tungsten silicide or tungsten formed by low pressure chemical vapor deposition of sufficient thickness to fill the cavity of said trench but deposited under selective deposition conditions favoring the deposition on the exposed surface of said trench but not on any other surface protected with a dielectric film.

21. A trench interconnection structure as in claim 12 which further comprises a semiconductor substrate, and wherein said buried regions are formed within said semiconductor substrate and are more heavily doped than said semiconductor substrate, and wherein said layer of semiconductor material comprises an epitaxial layer formed on said semiconductor substrate.

22. The structure of claim 21 wherein a supply voltage is applied to said substrate and said supply voltage is delivered to selected ones of said top surfaces of said regions of interconnect material.

23. The structure of claim 7 wherein a supply voltage is applied to said substrate and said supply voltage is delivered to said top surface of said region of interconnect material through said trench interconnect structure.

24. The structure of claims 1 or 2 which further comprises a doped region located near said top surface of said layer of semiconductor material, said doped region making direct electrical contact to said interconnect material at said aperture.

25. The structure of claim 24 wherein said buried region and said doped region located near said top surface are of a second conductivity type opposite said first conductivity type.

26. The structure of claims 1 or 2 which further comprises a gate electrode formed on a gate oxide on said top surface of said layer of semiconductor material, said gate electrode making electrical contact to said interconnect material through a buried contact opening in said gate oxide at said aperture.

27. An MOS logic inverter comprising:
an input terminal;
an output terminal; a resistive load formed of a trench resistor comprising:
  a layer of semiconductor material having a top surface, said layer formed of semiconductor material of first conductivity type;
  buried region spaced apart from said top surface of said layer of semiconductor material;
  a trench having an aperture at said top surface of said layer of semiconductor material and also having essentially vertical sidewalls extending into said layer of semiconductor material and into said buried region;
  a layer of insulating material covering those portions of said vertical sidewalls of said trench which are above said buried region and below said top surface of said semiconductor material; and
  interconnect material located within said trench and having a top surface near said top surface of said layer of semiconductor material and a bottom surface in contact with said buried region, said interconnect material forming a vertical trench electrical interconnection between said top surface of said interconnect material and said buried region; and
a switching transistor having:
  a source diffusion connected to one supply voltage;
  a drain diffusion connected to said output terminal as well as to said top surface of said trench resistor through said aperture; and
  a gate connected to said output terminal,
wherein the second supply voltage is applied to the buried end of said trench resistor through said bottom surface of said trench resistor to said buried region.

28. A structure as in claim 27 wherein said electrical interconnection has a resistance within the range of approximately $1 \times 10^6$ to $1 \times 10^{12}$ ohms.

29. A structure as in claim 27 wherein said electrical interconnection has a resistance within the range of approximately 50 to $1 \times 10^4$ ohms.

30. An MOS bistable static storage element comprising two cross-coupled inverters wherein each of said cross-coupled inverters comprises:
   an input terminal;
   an output terminal connected to the input terminal of the other inverter;
   a resistive load of a trench resistor comprising:
      a layer of semiconductor material having a top surface, said layer formed of semiconductor material of first conductivity type;
      a buried region spaced apart from said top surface of said layer of semiconductor material;
      a trench having an aperture at said top surface of said layer of semiconductor material and also having essentially vertical sidewalls extending into said layer of semiconductor material and into said buried region;
      a layer of insulating material covering those portions of said vertical sidewalls of said trench which are above said buried region and below said top surface of said semiconductor material; and
      interconnect material located within said trench and having a top surface near said top surface of said layer of semiconductor material and a bottom surface in contact with said buried region, said interconnect material forming a vertical trench electrical interconnection between said top surface of said interconnect material and said buried region; and
   a switching transistor having:
      a source diffusion connected to one supply voltage;
      a drain diffusion connected to said output terminal as well as to said top surface of said trench resistor through said top electrical contact means; and
      a gate connected to said input terminal,
   wherein the second supply voltage is applied to the buried end of said trench resistor through said bottom surface of said trench resistor to said buried region.

31. A structure as in claim 30 wherein said vertical trench resistor has a resistance within the range of approximately $1 \times 10^6$ to $1 \times 10^{12}$ ohms.

32. An array of MOS static random access memory cells wherein the bistable storage element of each cell comprises two cross-coupled inverters, wherein each of said cross-coupled inverters comprise:
   an input terminal;
   an output terminal connected to the terminal of the other inverter;
   a resistor load formed of a high resistivity trench resistor comprising:
      a layer of semiconductor material having a top surface, said layer formed of semiconductor material of first conductivity type;
      a buried region spaced apart from said top surface of said layer of semiconductor material;
      a trench having an aperture at said top surface of said layer of semiconductor material and also having essentially vertical sidewalls extended into said layer of semiconductor material and into said buried region and below said top surface of said semiconductor material;
      a layer of insulating material covering those portions of said vertical sidewalls of said trench which are above said buried region and below said top surface of said semiconductor material; and
      interconnect material located within said trench and having a top surface near said top surface of said layer of semiconductor material and a bottom surface in contact with said buried region, said interconnect material forming a vertical trench electrical interconnection between said top surface of said interconnect material and said buried region; and
   a switching transistor having:
      a source diffusion connected to one supply voltage;
      a drain diffusion connected to said output terminal as well as to said top surface of said trench resistor; and
      a gate connected to said input terminal,
   wherein the second supply voltage is applied to the buried end of said trench resistor through said bottom surface of said trench resistor to said buried region.

33. The array of MOS static random access memory cells of claim 32 wherein a plurality of adjacent cells share a common one of said buried regions.

34. A bipolar logic inverter comprising:
   an input terminal;
   an output terminal;
   a resistive load formed of a trench resistor comprising:
      a layer of semiconductor materail having a top surface, said layer formed of semiconductor material of first conductivity type;
      a first buried region spaced apart from said top surface of said layer of semiconductor material;
      a trench having an aperture at said top surface of said layer of semiconductor material and also having essentially vertical sidewalls extending into said layer of semiconductor material and into said first buried region;
      a layer of insulating material covering at least those portions of said vertical sidewalls of said trench which are above said buried region; and
      interconnect material located within said trench and having a top surface near said top surface of said layer of semiconductor material and a bottom surface in contact with said first buried region, said interconnect material forming a vertical trench resistor between said top surface of said interconnect material and said first buried region; and a switching transistor comprising:
      an emitter connected to a first supply voltage;
      a collector connected to said output terminal of said inverter and to a first end of said trench resistor; and
      a base connected to said input lead of said inverter; and
      means for connecting a second supply voltage to the second end of said trench resistor.

35. The bipolar logic inverter of claim 34 wherein said first end of said trench resistor comprises said top surface of said interconnect material, and said second end of said trench resistor comprises said bottom surface of said interconnect material.

36. The bipolar logic inverter of claim 35 further comprising:

a second buried region serving as said collector of said transistor; and a first trench interconnection structure for providing low resistance electrical connection of said second supply voltage to said first buried region, and a second trench interconnection structure for providing low resistance electrical connection of said second buried region to said output terminal, each of said first and second trench interconnection structures comprising:

a trench having an aperture at said top surface of said layer of semiconductor material and also having essentially vertical sidewalls extending into said layer of semiconductor material and into its associated one of said buried region;

a layer of insulating material covering at least those portions of said vertical sidewalls of said trench which are above said buried region; and interconnect material located within said trench and having a top surface near said top surface of said layer of semiconductor material and a bottom surface in contact with said buried region, said interconnect material forming a low resistivity vertical trench electrical interconnection between said top surface of said interconnect material and said buried region.

37. The inverter of claim 34 wherein said collector is connected to said output terminal of said inverter and through said first buried region to said bottom surface of said trench resistor and said second supply voltage is connected to said top surface of said interconnect material.

38. The inverter of claim 37 wherein said collector is merged with said first buried region and said first buried region is connected to said output terminal through a trench interconnection structure comprising:

a trench having an aperture at said top surface of said layer of semiconductor material and also having essentially vertical sidewalls extending into said layer of semiconductor material and into its associated one of said buried regions;

a layer of insulating material covering at least those portions of said vertical sidewalls of said trench which are above said buried region; and interconnect material located within said trench and having a top surface near said top surface of said layer of semiconductor material and a bottom surface in contact with said buried region, said interconnect material forming a low resistivity vertical trench electrical interconnection between said top surface of said interconnect material and said buried region.

39. A bipolar bistable static storage element comprising two cross-coupled bipolar logic inverters wherein each of said cross-coupled inverters comprises:

an input terminal;

an output terminal connected to the input terminal of the other inverter;

a resistive load formed of a trench resistor comprising:

a layer of semiconductor material having a top surface, said layer formed of semiconductor material of first conductivity type;

a first buried region spaced apart from said top surface of said layer of semiconductor material;

a trench having an aperture at said top surface of said layer of semiconductor material and also having essentially vertical side-walls extended into said layer of semiconductor material and into said first buried region;

a layer of insulating material covering at least those portions of said vertical sidewalls of said trench which are above said buried region; and interconnect material located within said trench and having a top surface near said top surface of said layer of semiconductor material and a bottom surface in contact with said buried region, said interconnect material forming a vertical trench electrical resistor between said top surface of said interconnect material and said buried region; and a switching transistor comprising:

an emitter connected to a first supply voltage;

a collector connected to said output terminal of said inverter and to a first end of said trench resistor; and a base connected to said input lead of said inverter; and means for connecting a second supply voltage to the second end of said trench resistor.

40. The bipolar logic inverter of claim 39 wherein, for each of said inverters, said first end of said trench resistor comprises said top surface of said interconnect material, and said second end of said trench resistor comprises said bottom surface of said interconnect material which is in contact with said first buried region.

41. The bipolar logic inverter of claim 40 further comprising:

a second buried region serving as said collector of said transistor; and a first trench interconnection structure for providing low resistance electrical connection of said second supply voltage to said first buried region, and a second trench interconnection structure for providing low resistance electrical connection of said second buried region to said output terminal, each of said first and second trench interconnection structures comprising:

a trench having an aperture at said top surface of said layer of semiconductor material and also having essentially vertical sidewalls extending into said layer of semiconductor material and into its associated one of said buried regions;

a layer of insulating material covering at least those portions of said vertical sidewalls of said trench which are above said buried region; and low resistivity interconnect material located within said trench and having a top surface near said top surface of said layer of semiconductor material, said interconnect material forming a vertical trench electrical interconnection between said top surface of said interconnect material and said buried region.

42. The bipolar bistable static storage element of claim 39 wherein, for each of said inverters, said collector is connected to said output terminal of said inverter and through said first buried region to said bottom surface of said trench resistor and said second supply voltage is connected to said top surface of said interconnect material.

43. The bipolar bistable static storage element of claim 42 wherein for each of said inverters, said collector is merged with said first buried region and said buried region is connected to said output terminal through a trench interconnection structure comprising:

a trench having an aperture at said top surface of said layer of semiconductor material and also having essentially vertical sidewalls extending into said layer of semiconductor material and into its associated one of said buried regions;

a layer of insulating material covering at least those portions of said vertical sidewalls of said trench which are above said buried region; and interconnect material located within said trench and having a top surface near said top surface of said layer of semiconductor material and a bottom surface in contact with said buried region, said interconnect material forming a low resistivity vertical trench electrical interconnection between said top surface of said interconnect material and said buried region.

44. A BICMOS structure formed in a layer of semiconductor material having a top surface comprising NMOS transistors, PMOS transistors, vertical NPN transistors, and a plurality of doped buried regions wherein any one of said doped buried regions are electrically contacted from the top surface with a low resistivity trench connector structure comprising:

a trench having an aperture at said top surface of said layer of semiconductor material and also having essentially vertical sidewalls extending into said layer of semiconductor material and into said buried region; and interconnect material located within said trench and in contact with said layer of semiconductor material along at least a portion of said vertical sidewalls and having a top surface near said top surface of said layer of semiconductor material, said interconnect material forming a vertical trench electrical interconnection between said top surface of said interconnect material and said buried region.

45. A trench interconnection structure as in claim 44 wherein said vertical sidewalls of said trench are covered with a layer of insulating material wherein said insulating material does not cover said buried region and said top surface at said aperture.

46. A very low resistivity trench connector structure as in claims 44 or 45 wherein said interconnect material comprises a low resistivity material such as policides, silicides, or refractory metals, thereby providing an electrical resistance between said top surface of said interconnect material and said buried region of less than approximately 10 ohms.

47. An integrated circuit wherein selected portions are electrically segregated from one another by surrounding each of said selected portions with very low resistivity trench connectors formed in long, narrow and deep trench segregation walls surrounding partially or completely said selected portions, wherein said low resistivity trench connectors comprise:

a trench having a long and narrow aperture at the top surface of a layer of semiconductor material and also having essentially vertical sidewalls extending deep into said layer of semiconductor material; and interconnect material located within said trench and in contact with said layer of semiconductor material along at least a portion of said vertical sidewalls, and having a top surface near said top surface of said layer of semiconductor material, said interconnect material forming a vertical trench electrical segregation wall between adjacent ones of said portions.

48. A very low resistivity trench connector structure as in claim 47 wherein said interconnect material comprises a low resistivity material.

49. A very low resistivity trench connector structure as in claim 47 wherein said interconnect material comprises tungsten silicide to tungsten formed by low pressure chemical vapor deposition of sufficient thickness to fill the cavity of said trench but deposited under selective deposition conditions favoring the deposition on the exposed surface of said trench but not on any other surface protected with a dielectric film.

50. A structure as in claim 47 wherein said low resistivity trench connector is held at a supply voltage, thereby forming an impenetrable barrier to minority carriers generated in the bulk of said semiconductor material of first conductivity type.

51. A trench interconnection structure comprising:

a layer of semiconductor material having a top surface, said layer formed of semiconductor material of first conductivity type;

a buried region spaced apart from said top surface of said layer of semiconductor material;

a trench having an aperture at said top surface of said layer of semiconductor material and also having essentially vertical sidewalls extending into said layer of semiconductor material and into said buried region;

interconnect material formed in a layer covering said sidewalls of said trench and having a top surface near the said top surface of said layer of semiconductor material, said interconnect material forming a vertical trench electrical interconnection between said top surface of said interconnect material and said buried region; and a filler material within the portion of said trench not covered by said interconnect material, wherein said interconnect material is heavily doped so as to reduce the electrical resistance between said top surface of said interconnect material and said buried region to within the range of approximately 50 and $10^4$ ohms.

52. A trench interconnection structure comprising:

a layer of semiconductor material having a top surface, said layer formed of semiconductor material of first conductivity type;

a buried region spaced apart from said top surface of said layer of semiconductor material;

a trench having an aperture at said top surface of said layer of semiconductor material and also having essentially vertical sidewalls extending into said layer of semiconductor material and into said buried region;

interconnect material formed in a layer covering said sidewalls of said trench and having a top surface near said top surface of said layer of semiconductor material, said interconnect material forming a vertical trench electrical interconnection between said top surface of said interconnect material and said buried region; and a filler material within the portion of said trench not covered by said interconnect material wherein said interconnect material comprises a low resistivity material, thereby providing an electrical resistance between said top surface of said interconnect material and said buried region of less than approximately 10 ohms.

53. A trench interconnection structure comprising:

a layer of semiconductor material having a top surface, said layer formed of semiconductor material of first conductivity type;

a buried region spaced apart from said top surface of said layer of semiconductor material;

a trench having an aperture at said top surface of said layer semiconductor material and also having essentially vertical sidewalls extending into said layer of semiconductor material and into said buried region;

interconnect material formed in a layer covering said sidewalls of said trench and having a top surface near said top surface of said layer of semiconductor material, said interconnect material forming a vertical trench electrical interconnection between said top surface of said interconnect material and said buried region; and a filler material within the portion of said trench not covered by said interconnect material wherein said interconnect material comprises a low resistivity material.

54. A trench interconnection structure comprising:

a layer of semiconductor material having a top surface, said layer formed of semiconductor material of first conductivity type;

a buried region spaced apart from said top surface of said layer of semiconductor material;

a trench having an aperture at said top surface of said layer of semiconductor material and also having essentially vertical sidewalls extending into said layer of semiconductor material and into said buried region;

interconnect material formed in a layer covering said sidewalls of said trench and having a top surface near said top surface of said layer of semiconductor material, said interconnect material forming a vertical trench electrical interconnection between said top surface of said interconnect material and said buried region; and a filler material within the portion of said trench not covered by said interconnect material wherein said interconnect material comprises tungsten silicide or tungsten formed by low pressure chemical vapor deposition of sufficient thickness to fill the cavity of said trench but deposited under selective deposition conditions favoring the deposition on the exposed surface at said bottom of said trench but not on any other surface protected with a dielectric film.

55. A trench interconnection structure as in claim 44 wherein said interconnect material is formed in a layer covering said sidewalls of said trench, further comprising a filler material within the portion of said trench not covered by said interconnect material.

56. A trench interconnection structure as in claim 55 wherein said filler material has a higher resistivity than said interconnect material.

57. A trench interconnection structure as in claim 56 wherein said interconnect material comprises undoped polycrystalline silicon, doped polycrystalline silicon, or polycrystalline silicide, and said filler material comprises doped polycrystalline silicon, undoped polycrystalline silicon, silicon dioxide, or silicon nitride.

58. A trench interconnection structure as in claim 47 wherein said interconnect material is formed in a layer covering said sidewalls of said trench, further comprising a filler material within the portion of said trench not covered by said interconnect material.

59. A trench interconnection structure as in claim 58 wherein said filler material has a higher resistivity than said interconnect material.

60. A trench interconnection structure as in claim 59 wherein said interconnect material comprises undoped polycrystalline silicon, doped polycrystalline silicon, or polycrystalline silicide, and said filler material comprises doped polycrystalline silicon, undoped polycrystalline silicon, silicon dioxide, or silicon nitride.

61. A structure as in claim 21 wherein said interconnect material comprises policide, silicide, or refractory metal, and said filler material comprises doped polycrystalline silicon, undoped polycrystalline silicon, silicon dioxide, or silicon nitride.

62. A structure as in claim 56 wherein said interconnect material comprises policide, silicide, or refractory metal.

63. A structure as in claim 61 wherein said interconnect material comprises policide, silicide, or refractory metal.

64. A structure as in claim 62 wherein said interconnect material comprises policide, silicide or refractory metal, and said filler material comprises doped polycrystalline silicon, undoped polycrystalline silicon, silicon dioxide, or silicon nitride.

* * * * *

UNITED STATES PATENT AND TRADEMARK OFFICE
CERTIFICATE OF CORRECTION

PATENT NO. : 4,933,739
DATED : June 12, 1990
INVENTOR(S) : Eliyahou Harari

It is certified that error appears in the above-identified patent and that said Letters Patent is hereby corrected as shown below:

Claims 65 and 66 are added as follows:

65. A structure as in claim 18 wherein said interconnect material provides an electrical resistance between said top surface of said interconnect material and said buried region of less than approximately 10 ohms.

66. A structure as in claim 18 wherein said interconnect material comprises polycide, silicide, or refractory metal.

Signed and Sealed this

Seventh Day of January, 1992

Attest:

HARRY F. MANBECK, JR.

*Attesting Officer*     *Commissioner of Patents and Trademarks*